(12) United States Patent
Imada et al.

(10) Patent No.: US 8,293,125 B2
(45) Date of Patent: Oct. 23, 2012

(54) METHOD AND DEVICE FOR MANUFACTURING STRUCTURE HAVING PATTERN, AND METHOD FOR MANUFACTURING MOLD

(75) Inventors: Aya Imada, Tokyo (JP); Toru Den, Tokyo (JP); Takashi Nakamura, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1239 days.

(21) Appl. No.: 11/995,170

(22) PCT Filed: Sep. 5, 2006

(86) PCT No.: PCT/JP2006/317938
§ 371 (c)(1),
(2), (4) Date: Jan. 9, 2008

(87) PCT Pub. No.: WO2007/029845
PCT Pub. Date: Mar. 15, 2007

(65) Prior Publication Data
US 2009/0120904 A1   May 14, 2009

(30) Foreign Application Priority Data

Sep. 6, 2005   (JP) .................................. 2005-257408
Mar. 15, 2006  (JP) .................................. 2006-070832
Aug. 28, 2006  (JP) .................................. 2006-230610

(51) Int. Cl.
*C03C 15/00*  (2006.01)
(52) U.S. Cl. ................ 216/41; 216/44; 216/52; 216/54

(58) Field of Classification Search .................... 216/41, 216/44, 52, 54
See application file for complete search history.

(56) References Cited

U.S. PATENT DOCUMENTS

| | | | |
|---|---|---|---|
| 2,249,419 A | 7/1941 | Craine et al. | |
| 4,887,282 A * | 12/1989 | Mueller | 378/34 |
| 5,894,032 A | 4/1999 | Green et al. | |
| 6,069,931 A | 5/2000 | Miyachi et al. | 378/34 |
| 7,919,021 B2 * | 4/2011 | Baba et al. | 264/1.6 |
| 2004/0055482 A1 * | 3/2004 | Grounds et al. | 101/35 |
| 2006/0280110 A1 * | 12/2006 | Katoh et al. | 369/283 |

FOREIGN PATENT DOCUMENTS

| | | |
|---|---|---|
| CA | 2 291 099 A1 | 11/1998 |
| CN | 1262647 A2 | 8/2000 |
| DE | 3639346 A1 | 5/1988 |

(Continued)

OTHER PUBLICATIONS

Wikipedia, The Free Encyclopedia, "Elastic modulus", via http://en.wikipedia.org/wiki/Elastic_modulus ; 3 pages; 2011.*

(Continued)

*Primary Examiner* — Binh X Tran
(74) *Attorney, Agent, or Firm* — Fitzpatrick, Cella, Harper & Scinto

(57) ABSTRACT

A structure having a pattern is manufactured. An elastically deformable process target is elastically deformed in an inplane direction from a first state. A first pattern is formed on the process target deformed. The elastically deformed process target is made close to or returned to the first state, thereby to form a second pattern having a size and a shape at least one of which differs from those of the first pattern.

7 Claims, 16 Drawing Sheets

SURFACE

SECTION

FOREIGN PATENT DOCUMENTS

| | | | |
|---|---|---|---|
| DE | 69804785 A1 | 11/2002 |
| EP | 0 268 203 A1 | 5/1988 |
| ES | 2175711 A1 | 11/2002 |
| GB | 2326276 A1 | 12/1998 |
| JP | S 60-000929 | 1/1985 |
| JP | 63-283022 A1 | 11/1988 |
| JP | 3175836 A2 | 7/1991 |
| JP | 60-000929 | 1/1994 |
| JP | 10-242033 A | 9/1998 |
| JP | 2000512937 A2 | 10/2000 |
| JP | 2003-36618 A | 2/2003 |
| RU | 2197392 A | 1/2003 |
| WO | 98/52756 A1 | 11/1998 |

OTHER PUBLICATIONS

PCT International Search Report mailed Apr. 16, 2007, for International Application No. PCT/JP2006/317938.

Written Opinion of the International Preliminary Examining Authority mailed Apr. 16, 2007.

* cited by examiner

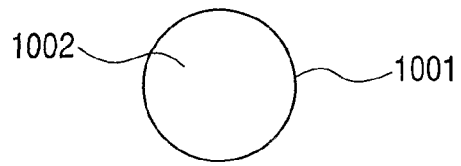
FIG. 1A
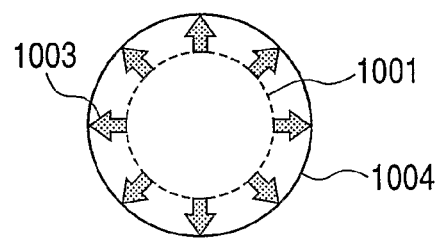
FIG. 1B
FIG. 1C
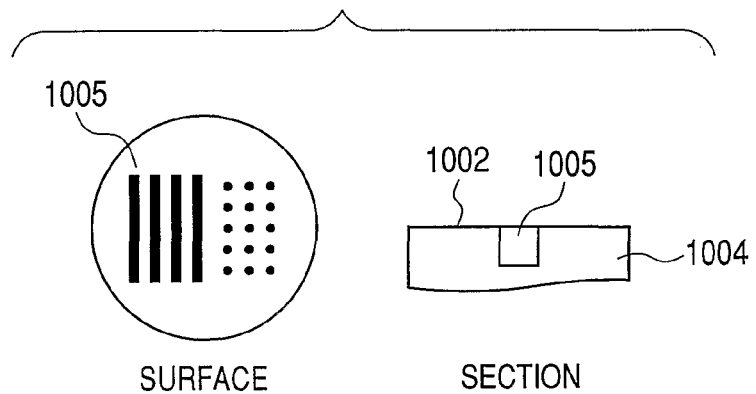
SURFACE          SECTION
FIG. 1D
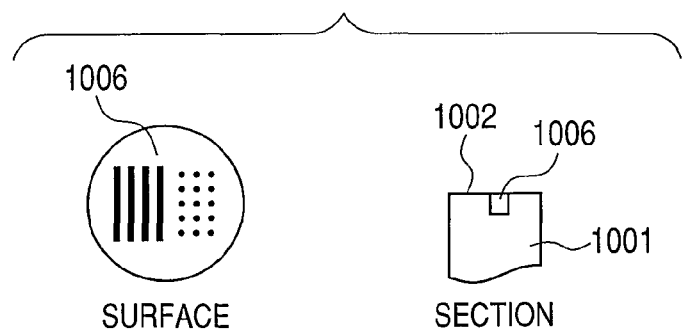
SURFACE          SECTION

METHOD AND DEVICE FOR MANUFACTURING STRUCTURE HAVING PATTERN, AND METHOD FOR MANUFACTURING MOLD This Application is a National Stage filing under 35 U.S.C. §371 of International Application No. PCT/JP2006/317938, filed Sep. 5, 2006.

TECHNICAL FIELD

The present invention relates to a method and a device for manufacturing a structure having a pattern, and a method for manufacturing a mold, and particularly to a method and device for manufacturing a structure having a nanoscale pattern and a method for manufacturing a mold.

BACKGROUND ART

There are methods for manufacturing a microstructure on a surface of a substance, such as photolithography, electron beam exposure (Japanese Patent Application Laid-Open No. 2003-068618), X-ray exposure, nano imprint lithography, etc.

The photolithography, however, has draw pattern accuracy which depends on the wavelength of light used. At present, single dots each having a diameter of 10 nm can be formed even by the electron beam exposure capable of producing a microstructure of the smallest scale. There are difficulties in arraying these dots at a pitch of 20 nm or less by the electron beam exposure.

Meanwhile, there is a method for correcting pattern shapes and the like by deforming a mask substrate made of glass or metal (Japanese Patent Application Laid-Open No. H10-242033). In this case, the extension/reduction rate does not reach even 1%. Therefore, a draw pattern which has once been drawn can hardly be changed by use of this method.

DISCLOSURE OF THE INVENTION

The present invention provides a method and a device for manufacturing a structure having a new pattern, and a method for manufacturing a mold, which are capable of changing a pattern which has once been formed.

According to a first aspect of the present invention, a method for manufacturing a structure having a pattern includes: elastically deforming an elastically deformable process target in an inplane direction from a first state; forming a first pattern on the process target deformed; and making the elastically deformed process target close to the first state or returning the elastically deformed process target to the first state, thereby to form a second pattern having a size and a shape at least one of which differs from those of the first pattern.

According to a second aspect of the present invention, a method for manufacturing a structure having a pattern includes: elastically deforming an elastically deformable process target in an inplane direction from a first state; forming a pattern member on a surface of the process target deformed, the pattern member being constituted by including a material different from that of the process target; and making the elastically deformed process target close to the first state or returning the elastically deformed process target to the first state, while maintaining a contact area between the pattern member and the process target.

According to a third aspect of the present invention, a method for manufacturing a structure having a pattern includes: layering a pattern-forming layer on an elastically deformable process target, the pattern-forming layer constituted by including a material different from that of the process target; elastically deforming the pattern-forming layer at least in an inplane direction; forming a pattern on the pattern-forming layer deformed; making a contact area between the pattern-forming layer and the process target equal to a contact area in a state before elastically deforming the pattern-forming layer.

According to a fourth aspect of the present invention, a method for manufacturing a structure having a pattern includes: preparing an elastically deformed process target having a pattern constituted by a projecting structure on a surface of the process target; etching thereafter the process target, using the pattern as a mask; and relaxing the elastically deformed state of the process target after etching the process target.

According to a fifth aspect of the present invention, a method for manufacturing a structure having a pattern includes: preparing an elastically deformed process target having a pattern constituted by a projecting structure on a surface of the process target; relaxing thereafter the elastically deformed state of the process target; and etching thereafter the process target, using the pattern as a mask.

According to a sixth aspect of the present invention, a method for manufacturing a structure having a pattern includes: preparing a first process target having a pattern; deforming the first process target by reducing the first process target in scale; and using the first process target reduced in scale, to transfer the pattern reduced in scale, which the first process target has, to a second process target.

According to a seventh aspect of the present invention, a device for manufacturing a structure having a pattern includes: an extending unit for extending a process surface on a process target in an inplane direction; a cooling unit for cooling the process surface; and a pattern forming unit for forming a pattern on the process surface.

According to an eighth aspect of the present invention, in a method for manufacturing a mold, a material is filled in a pattern which a structure has, the structure being obtainable by the method for forming a structure having a pattern as mentioned above.

To solve problems described above, also according to the present invention, there are provided a method and a device for manufacturing a structure having a pattern, and the structure having a pattern, which are configured as follows.

That is, a method for manufacturing a structure having a pattern, according to the present invention, includes: (1-1) a first elastic deformation step of elastically deforming a process surface of a process target in at least an inplane direction, the process target based on an elastically deformable material; (1-2) a first pattern forming step of forming a pattern on the process surface deformed by the first elastic deformation step; and (1-3) a second pattern forming step of making the process target close to a force free state before elastic deformation or bringing the process target into a force free state, thereby to form on the process surface a pattern having a size and a shape at least one of which differs from those at the time of forming the first pattern on the process surface.

Alternatively, a method for manufacturing a structure having a pattern, according to the present invention, includes: (2-1) a first elastic deformation step of elastically deforming a process surface of a process target in at least an inplane direction, the process target based on an elastically deformable material; (2-2) a third pattern forming step of forming a pattern on the process surface deformed by the first elastic deformation step, the pattern constituted by including a material different from the process target; and (2-3) a fourth pattern forming step of making the process target close to a force free state before elastic deformation or bringing the process target into a force free state, thereby to form on the process surface a pattern having a size and a shape at least one of which differs from those at the time of the third pattern forming. In particular, a pattern-forming layer made of a material different from the process target has higher elastic modulus than the process target, including a case that a contact area between the pattern-forming layer and the surface of the process target is unchanged between before and after the fourth pattern forming step.

Alternatively, a method for manufacturing a structure having a pattern, according to the present invention, includes: (3-1) a fifth step of forming a pattern-forming layer on the surface of the process target based on an elastically deformable material; and (3-2) a sixth elastic deformation step of elastically deforming the surface of the pattern-forming layer in at least an inplane direction. In this case, deformation of the process target in an inplane direction can be performed by extension or reduction at an equal rate in all of the inplane directions. Further, deformation of the process target in an inplane direction of the process surface may be performed by extension in one or more directions among the inplane directions and by reduction in one or more different directions.

Alternatively, a method for manufacturing a structure having a pattern, according to the present invention, includes: (4-1) a fifth pattern forming step of forming a pattern on a process surface of a process target based on an elastically deformable material; and (4-2) a step of elastically deforming the process target in at least an inplane direction.

Alternatively, a method for manufacturing a structure having a pattern, according to the present invention, includes: (5-1) a sixth pattern forming step of forming a pattern on a process surface of a process target based on a plastically deformable material; and (5-2) a step of plastically deforming the process target in at least an inplane direction after forming the pattern in the above step.

In the present invention, arrays having cycles different from one another can be formed in the forming of the pattern having a size and a shape at least one of which differs. Also, the present invention includes a configuration in which the rate of elastic or plastic deformation in a direction is not higher than 90% or not smaller than 110%. In the present invention, the process target can be constituted by a material having elastic modulus of 1 to 20 MPa. In this case, the material can be constituted by crosslinked elastomer or thermoplastic elastomer. Also in the present invention, the process surface can be flat or curved.

The structure having a pattern according to the present invention has a configuration as follows. That is, a pattern is formed on a process surface of a process target made of an elastically deformable material and maintaining an elastically deformed state, and the deformation rate of the process surface is approximated to a force free state or brought into a force free state. Thus, the pattern shape is deformed. This deformation includes a case that elastic or plastic deformation is effected at an equal rate in all inplane directions.

The present invention includes a case that the process surface is extended in one or more directions among the inplane directions and is reduced in one or more different direction. Also, the present invention can have a configuration in which the pattern formed on the process surface of the process target has a shape like a line or dot.

The device for manufacturing a structure having a pattern, according to the present invention, includes: a mechanism by which a process surface on a process target is extended uniformly in an inplane direction or a predetermined direction at a predetermined deformation rate; a mechanism which cools the process surface; and a mechanism which processes a pattern on the process surface. In the device, the mechanism which processes a pattern on the process surface can perform imprinting with use of a mold, and at least one of a mechanism which heats the mold and a mechanism which irradiates the mold with light and a mechanism pressing the mold can be included. In this case, a phrase of "form a pattern in a process surface" means that a material forming the process surface is processed. Another phrase of "form a pattern on a process surface" means that the process surface is taken as a substrate and a structure constituted by including a material different from the process surface is formed as a pattern on the process surface.

Another aspect of the present invention relates to a process of forming a microstructure in a process surface, taking as the process surface a part of a surface of a process target at least a surface of which is made of an elastically deformable material. A micropattern shape is formed in a process target surface by: a step (1) in which a transfer pattern made of a material having higher elastic modulus than the process target is formed in a substrate surface for peeling; a step (2) in which the process target is elastically deformed at least in an inplane direction; a step (3) in which at least a part of the transfer pattern is embedded into the process target from the process surface, and the substrate for peeling and the transfer pattern are separated from one another; and a step (4) in which a shape of the process target in which the transfer pattern has been embedded from the process surface is made close to a force free state or brought into a force free state, to change intervals between transfer patterns from those at the time of transfer.

Further, another aspect of the present invention relates to a process of forming a microstructure in a process surface, taking as the process surface a part of a surface of a process target at least a surface of which is made of an elastically deformable material. A micropattern shape is formed in a process target surface by: a step (1) in which a transfer pattern made of a material having higher elastic modulus than the process target is formed in a substrate surface for peeling; a step (3) in which the transfer pattern is embedded into the process target from the process surface, and the substrate for peeling and the transfer pattern are separated from one another; and a step (4) in which the process target in which at least a part of the transfer pattern is embedded from the process surface is elastically deformed, and intervals between the transfer patterns are changed from those at the time of transfer.

Yet another aspect of the present invention relates to process of forming a microstructure in a process surface, taking as the process surface a part of a surface of a process target at least a surface of which is made of a plastically deformable material. A micropattern shape is formed in a process target surface by: a step (1) in which a transfer pattern made of a material having higher elastic modulus than the process target is formed in a substrate surface for peeling; a step (3) in which the transfer pattern is embedded into the process target from the process surface, and the substrate for peeling and the transfer pattern are separated from one another; a step (4) in which the process target in which at least a part of the transfer pattern is embedded from the process surface is plastically deformed, and intervals between the transfer patterns are changed from those at the time of transfer; and a step (5) in which at least a part of the transfer patterns embedded in at least a part of the process surface is removed.

Thus, according to the present invention, a pattern which has once formed can then be deformed. According to the second or third aspect of the present invention, the contact area with the process target is finally returned to an original area. Hence, there can be provided a configuration in which stress hardly remains in the pattern layer. This effectively prevents a pattern layer from being peeled off from the process target.

In the present invention, concept of reduction (in scale) covers not only isotropic reduction but also anisotropic reduction (e.g., a case that extension in one axis direction causes reduction in a direction perpendicular to the axis).

BRIEF DESCRIPTION OF THE DRAWINGS

FIGS. 1A, 1B, 1C, and 1D are schematic cross-sectional views for depicting the present invention;

BEST MODE FOR CARRYING OUT THE INVENTION

First Embodiment: First Invention

Figure 2A:
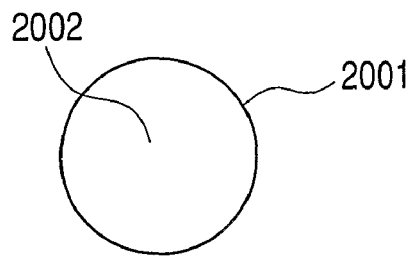
FIGS. 2A, 2B, and 2C are schematic cross-sectional views for depicting the present invention.

The first embodiment of the present invention will now be described with reference to an exemplar configuration in which a structure having a pattern is prepared by forming a pattern on a process target made of elastically deformable material after extending or reducing the process target. An example described below is formed in a manner that a pattern is formed on a process substrate which has once been extended uniformly in all inplane directions and then the process substrate is returned to a force free state before extended to thereby form a reduced pattern shape.

Outline of manufacturing process in the above exemplar configuration will be described with reference to FIGS. 1A to 1D which will be described in more details in the first embodiment described later.

At first, a process surface 1002 to be processed of a process substrate 1001 having a first state (force free state) shown in FIG. 1A is extended uniformly in all inplane directions, to obtain a deformed process substrate 1004 as shown in FIG. 1B. As far as the process substrate is a flat sheet, any extension method is available, e.g., the process substrate may be extended by mechanical pulling, rotating the substrate, or like a balloon by air pressure. Extension is not limited to all directions but may be performed in one axial direction.

The process target is suitably of a material having rubber elasticity of a low elastic modulus (for example, 1 MPa to 20 MPa). Generally, preferable materials are high polymer materials called elastomers and having remarkable elasticity such as rubber. Elastomers are divided into crosslinked elastomers (natural rubber and synthetic rubber vulcanizate) and thermoplastic elastomers. These elastomers can be extended enough even by weak force and deformed to be five times longer. However, original shapes are recovered as soon as the force is released. The elastic modulus generally has a dependency on temperature. For example, there are elastomers of styrene series (SBC), olefin series (TPO), vinyl chloride series (TPVC), urethane series (PU), ester series (TPEE), amide series (TPAE), etc. Among these elastomers, crosslinked elastomers are polybutadiene, polyisoprene, and the like having a glass transition temperature lower than room temperature. These crosslinked elastomers do not have fluidity by heating. Thermoplastic elastomers are polyester elastomer (TPC), styrene-butadiene-styrene triblock copolymer (SBS), and the like. These elastomers are easy to mold and process because fluidity appears when the elastomers are heated. However, thermoplastic elastomers structurally have features of thermoplastics. Therefore, permanent set thereof is greater as compared with that of general crosslinked elastomers. Consequently, deterioration in physical properties of rubber progresses rapidly due to rise of temperature and may cause plastic deformation at high temperature.

Next, a pattern 1005 is formed on the process surface 1002 while maintained in the deformed state. Available pattern forming methods are photolithography using ultraviolet rays, visible light, or the like, electron beam lithography, ion beam lithography, X-ray exposure, nanoimprint lithography, machine processing, wet etching technology, dry etching technology, and the like. Any of these methods can be used as far as the method is capable of forming a concave or convex pattern 5-1. At this time, the process substrate in the deformed state flows due to heat if the process substrate is made of, for example, a thermoplastic elastomer and if a process method such as thermal imprint lithography which may heat the process surface is used. There hence is a risk that the process substrate cannot recover a shape before deformation, and some care for the risk is necessary. Since very small drifting sometimes occurs on the process surface in the deformed state, the pattern shape may be deformed if a method like the electron beam lithography is used. In this case, it is effective to cool the process surface.

Next, deformation rate of elastic deformation is changed to be close to that of a force free state or the elastically deformed state is released to bring the process surface 1002 into a force free state (FIG. 1D). As a result of this, a pattern shape 1006 is obtained in accordance with the deformation as described above. In general, if the deformation rate in a direction is 100% or higher, the pattern shape in the direction reduces. Otherwise, if 100% or lower, the pattern shape in the direction expands. The deformation rate means a ratio of a length of a substance after deformation to a length thereof before deformation. If a regular array pattern of lines is drawn on a substrate extended uniformly in an inplane direction, the pitch after release of the extension becomes 100/A times greater when the deformation rate is A %. At this stage, for example, a pattern may be formed by extension at a deformation rate of 500%, and thereafter, the deformation rate may be reduced to 200% and used intact. Widths and depths of lines vary to be deep or shallow depending on pattern shapes, sheet thicknesses before and after deformation and surface tension of a process substrate material. Process targets available for the present invention are preferably of a material which does not break down or so even when the material is deformed by 5% or more, as an absolute value, from a state where external force is released. The material is more preferably capable of withstanding deformation of 10% or more or most preferably capable of withstanding deformation of 50% or more, as an absolute value. The pattern to be formed on the process targets in the present embodiment may be formed as depressions or grooves, or a projection pattern is available. A projection pattern may be made of the same material as the process targets or material different from the process targets.

Figure 3A:
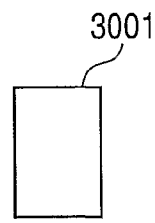
FIGS. 3A, 3B, 3C, and 3D are schematic cross-sectional views for depicting the present invention.
Figure 3B:
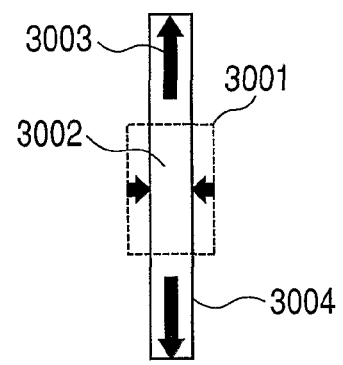
Figure 3C:
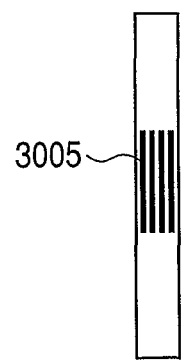

In FIGS. 3A to 3D, at first, a process object (force free state) 3001 is prepared (FIG. 3A) and is extended in an axial direction 3003 (FIG. 3B). A pattern forming area formed thereby is denoted at 3002. Reference numeral 3004 denotes a process object after extension. Next, a pattern 3005 is formed (FIG. 3C). Thereafter, external force is released or loosened to bring the process object into a force free state (or make the process object to be close to that state). 3006 denotes a deformed pattern, and arrows in FIG. 3D indicate deformation directions of the object.

Second Embodiment

Figure 2B:
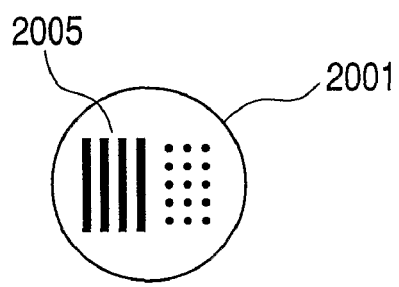
Figure 2C:
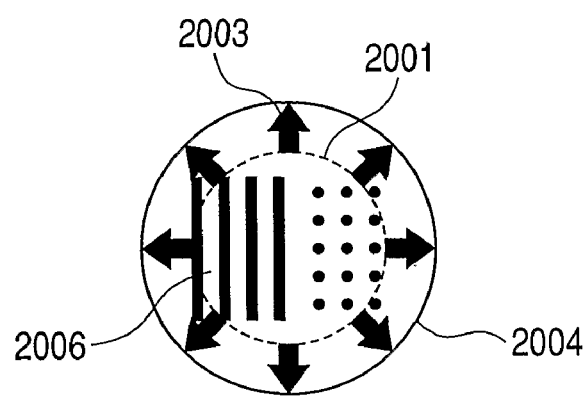

The second embodiment of the present invention will now be described with reference to an exemplar configuration in which a structure having a pattern is manufactured by extending or reducing a process substrate after forming a pattern on the process target made of elastically deformable material. The deformation mode of extension or reduction can be employed. For example, as shown in FIGS. 2A to 2C, a pattern 2005 is formed on a process surface 2002 of a process substrate 2001, and the process substrate 2001 is thereafter deformed by extension or reduction as indicated by an arrow 2003. Thus, a pattern shape 2006 is obtained in accordance with the deformation.

Third Embodiment

The third embodiment of the present invention will now be described with reference to an exemplar configuration in which a structure having a pattern is manufactured by extending or reducing a process substrate after forming a pattern on the process target made of plastically deformable material.

Figure 5A:
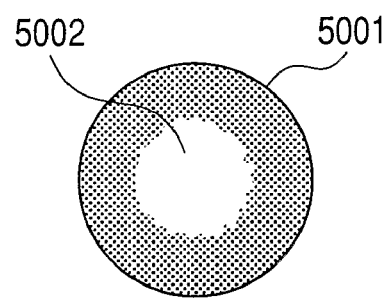
FIGS. 5A, 5B, and 5C are schematic cross-sectional views for depicting the present invention.

A manufacturing process thereof will be described in details later in the example 5, for example. A surface of a process substrate 5001 made of plastically deformable material as shown in FIG. 5A is taken as a process surface 5002. A pattern 5005 is formed on the process surface as shown in FIG. 5.

Figure 5B:
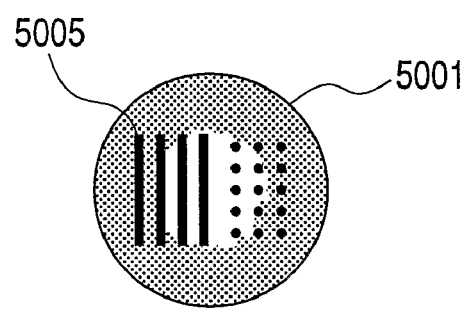
Figure 5C:
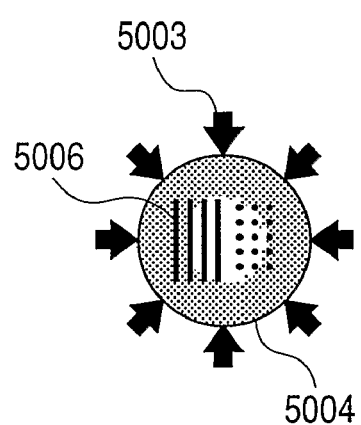

Next, a force which will cause extension or reduction at least on the process surface is applied as indicated by an arrow 5006 to effect plastic deformation. Thus, a process substrate after deformation as shown in FIG. 5C is obtained, together with a pattern shape 5006 in accordance with the deformation. 5001 denotes a process substrate in a force free state. A flat circular shape or even a spherical shape is available as the shape of the process substrate. 5004 denotes the process substrate after deformation. To cause uniform compression in a process surface by plastic deformation, for example, there is a method of applying uniformly a pressure on a spherical process substrate by air pressure or liquid pressure. In this case, various organic and inorganic materials are available as process targets. The term of process target may mean the process substrate or an organic material or the like formed on the process substrate.

Substances preferable for uniform deformation are those that have a flat and smooth surface and internally have smaller pores at uniform density than patterns or those (such as plastics) that cause plastic deformation as a result of changing a molecular structure by applying pressure.

Figure 10A:
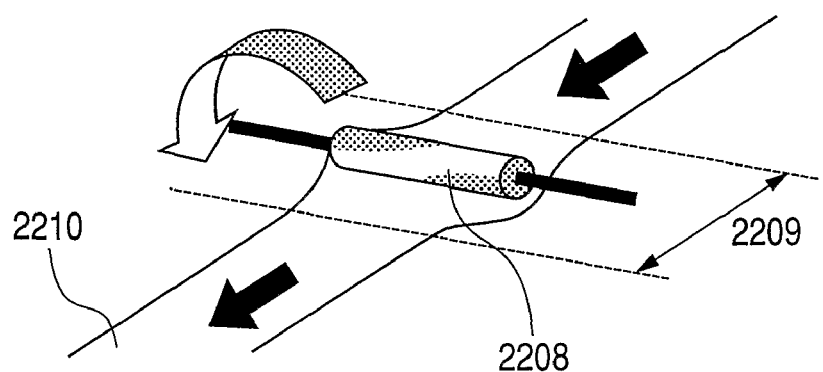
FIGS. 10A and 10B depict an exemplar configuration according to the example 9 of the present invention, in which a roller mold is used when forming a pattern on a pattern-forming layer and a process surface.
Figure 10B:
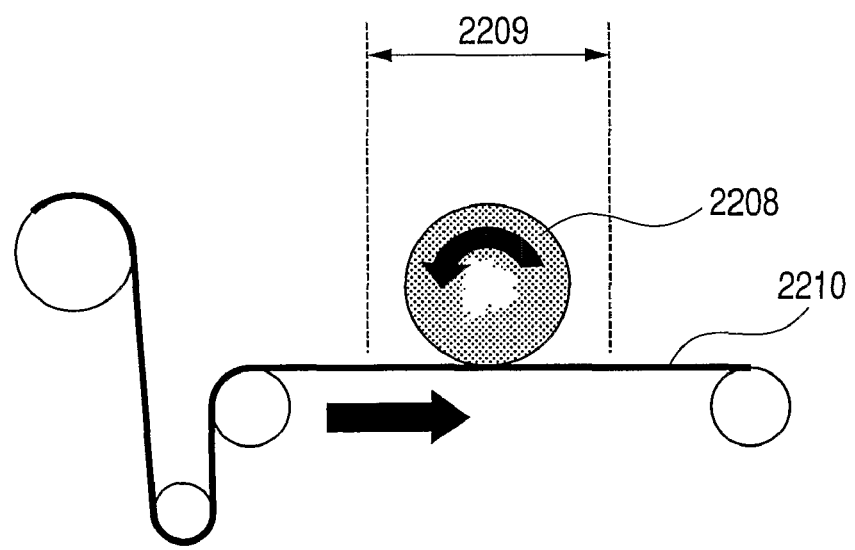

By adopting the method for manufacturing a structure having a pattern according to one of the above embodiments, for example, a process target having lines or dot-like shapes on a wafer can be manufactured. In the thermal imprint method described above, for example, a roller mold as shown in FIGS. 10A and 10B can be used. In this case, patterns can be formed sequentially on a long sheet-like process target.

Fourth Embodiment

In the fourth embodiment of the present invention, a part of elastically deformable material is a process surface, which is extended or reduced. This embodiment includes a case that the process surface is extended in a direction and is reduced in another direction. While maintained in this extended or reduced state, the material is fixed to a jig, resist or coat-type polymer is coated onto the process surface, and a thin film is formed as a pattern-forming layer. At this time, coating material is preferably such material that does not erode the process surface. If there is greater asperity than that of the pattern to be formed on the surface of the process target, flatness is raised by forming a film by coating so that a micropattern can be easily formed.

Next, a pattern is formed by photolithography using a conventional mask for a pattern-forming layer, EB direct writing, or a thermal or UV imprint method. For example, in case of photoresist, ultraviolet light or the like is irradiated using a chromium vapor deposited mask, and development is performed using a developing solution, to form a pattern. Alternatively, for example, in case of a thermal imprint method, a thermosoftening point of a polymer to be coated is preferably set lower than that of the process surface. Further, a press mold is heated to a temperature which is equal to or lower than a softening point of the polymer and is equal to or higher than a softening point of the process surface. The press mold is pressed against the polymer and peeled after cooling. The polymer remains in depressions of a pattern formed. If the remaining polymer may still become an obstacle after extension or reduction to be effected next on the process surface, the polymer in the depressions needs to be removed by a dry etching method or wet etching method. At this time, a pattern may be formed in the process surface or not. The pattern to be formed preferably has a projecting structure, and adjacent structures are preferably separated from one another.

Next, the process surface is detached from the jig and is released from an extended or reduced state. Then, a pattern according to the deformation is formed. Since the pattern merely sticks to the process surface, the pattern may be peeled if the process surface is extended or reduced too much. Hence, the pattern is peeled less easily as the pattern contacting the process surface has a smaller cross section. The pattern finally formed can be transferred to another substrate. In the thermal imprint method described above, a roller mold as shown in FIGS. 10A and 10B can be used. In this case, patterns can be formed sequentially on a long sheet-like process target.

Fifth Embodiment

The fifth embodiment of the present invention will be described with reference to an exemplar method of processing a different material such as a wafer by use of a pattern formed on an elastic or plastic substance as described above.

According to the method described in the first embodiment, a surface of a process target made of an elastically deformable material is extended, and a depression line pattern or the like is processed in the process surface. The process surface is released from the extended state to form a micropattern. Next, a metal or organic film is formed on the surface by a method such as electroless plating or sputtering. This metal film or the like is peeled off from the elastic substance and can be used as a mold. If the mold is hot-pressed to a resin-made thin film layer formed on an arbitrary substrate such as a resin sheet or a semiconductor wafer, a depression pattern similar to that formed in the process surface of the elastic substance can be formed.

Use is possible after peeling the mold. Alternatively, an arbitrary substrate can be processed by a method such as dry etching using a resin-made thin film layer described above as a mask, and a pattern can be transferred thereto.

For example, if in a depression pattern formed in the elastic substance, film thickness is so small as several μm to several hundred nm or so at parts such as depression portions having small film thickness, the process surface of the elastic substance described above is set on an arbitrary substrate. Using this as a mask, a pattern can be transferred to the substrate by a method such as dry etching or the like. At this time, processing by dry etching or the like is facilitated if the aspect ratio of the pattern is relatively high.

Sixth Embodiment: Second Invention

The sixth embodiment of the present invention will be described with reference to an exemplar configuration in which a pattern-forming layer made of a material different from a process target is formed on the process target, and a process substrate is extended or reduced, to form a structure having a pattern. See FIGS. 8A to 8D.

Figure 8A:
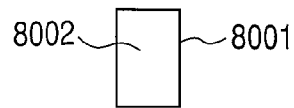
FIGS. 8A, 8B, 8C, and 8D depict an exemplar configuration according to the example 7 of the present invention, in which a separate pattern made of a material different from a process substrate is formed on the process substrate and the process substrate is reduced in scale to form a pattern shape.
Figure 8B:
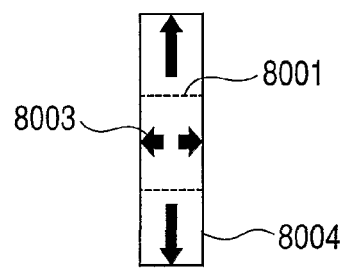
Figure 8C:
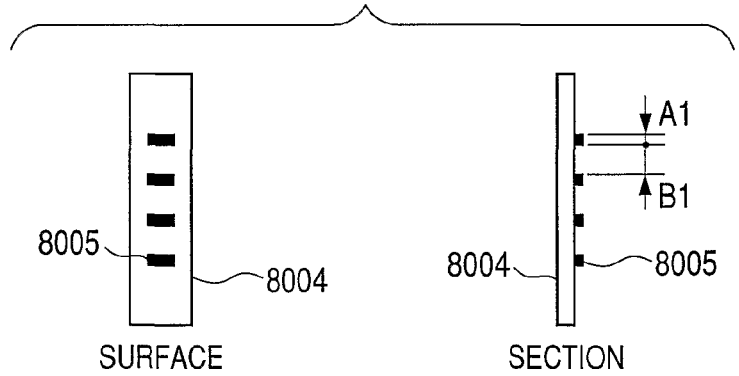

A process target 8001 made of an elastic material having a force free state shown in FIG. 8A is extended to elongate in one direction as shown in FIG. 8B. 8002 denotes a pattern-forming surface. A pattern-forming layer is preferably a material having higher elastic modulus than the process target. A pattern 8005 is constituted by pattern constituent members having a protruding shape (or projecting structure) as shown in FIG. 8C.

Figure 8D:
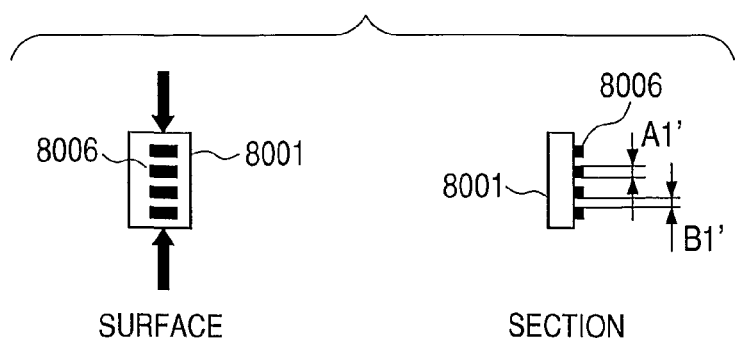

Next, the process target is returned to a force free state or the deformation rate is lowered to become close to the force free state. Then, the interval between one and another of pattern constituent members of a pattern 8006 is narrowed as shown in FIG. 8D. At this time, if the elastic modulus of the pattern is high, the contact area where the process target contact the pattern constituent members stays permanently unchanged. That is, the contact area between the process target and the pattern constituent members is maintained.

At this time, a length of the projecting pattern 8005 in one section thereof penetrating a pattern in an extension direction is expressed as A1. Another length of a part including no pattern (depression portion) is expressed as B1. A length of a pattern 8006 after elastic deformation in FIG. 8D is expressed as A1', and another length of a part thereof including no pattern is expressed as B1'. In this section, a total length of the projecting pattern 8005 is expressed as A, and another total of lengths of parts including no pattern is expressed as B. Then, the following relationships are satisfied. That is, if the contact area of the pattern is constant, parts including no pattern shrink more than the other parts including the pattern near the surface of the process target. Therefore, satisfied relationships are A=A1+A2+ . . . +An, B=B1+B2+ . . . +Bn, and (A/B)<(A'/B'). If the elastic modulus of the pattern-forming layer is not much different from that of the process target so that the length A varies as the process target shrinks, parts including no pattern shrink more, and therefore, the foregoing relationships are satisfied.

Seventh Embodiment: Third Invention

The seventh embodiment of the present invention will be described with reference to an exemplar configuration as follows, in which a structure having a pattern is manufactured. That is, a pattern-forming layer made of a material different from a process target is formed on the process target. A process substrate is elastically deformed, and thereafter, a pattern is formed. The process substrate is elastically deformed again to make a surface area of the process substrate to be substantially equal to that of an initial force free state. Thus, the structure having a pattern is manufactured. See FIGS. 9A to 9E.

Figure 9A:
FIGS. 9A, 9B, 9C, 9D and 9E depict an exemplar configuration according to the example 8 of the present invention, in which a pattern-forming layer made of a material different from a process substrate is formed on the process substrate, a pattern is formed after extending the process substrate by elastic deformation, and shrinkage is carried out by elastic deformation again, to form a pattern shape.

A pattern-forming layer 9007 made of a different material from that of a process target 9001 is formed (FIG. 9B) on a surface 9002 of a process target 9001 made of an elastically deformable material and maintained in a force free state not applied with a force for extension or reducing (FIG. 9A).

Figure 9B:
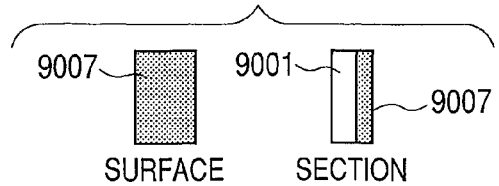
Figure 9C:
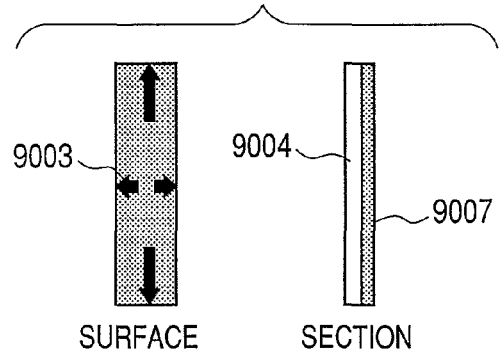

Next, extension as shown in FIG. 9C is effected on the process target 9001 so as to have a shape in which the process target is extended in one direction. At this time, a pattern-forming layer 9007 is thinner than before the extension. A process step shown in FIG. 9C may be an elastic deformation step.

Figure 9D:
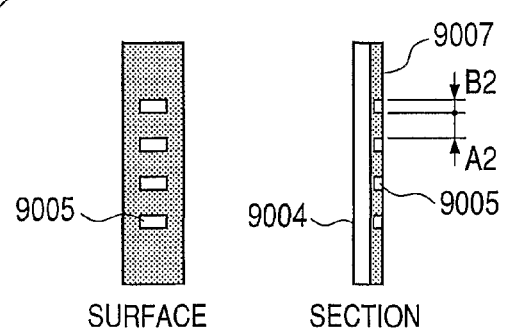

Next, a pattern 9005 is formed on the pattern-forming layer (FIG. 9D). Further, a force kept applied for the extension is released from the process substrate 9004, to recover a state having the same surface area as that in the previous force free state when the pattern-forming layer was formed.

That is, the contact area between the pattern-forming layer and a surface of the process target is made equal to the contact area at the time of a fifth elastic deformation step. Thus, a micropattern can be formed.

To deform (extend or reduce) a process target in the present or other embodiments, for example, the process target is stuck onto a extendable substrate in advance. By extending the substrate, the process target can be deformed so as to be tensioned by deformation of the substrate. A tension force may be applied in a state in which the process target is clamped between end portions thereof. Alternatively, the process target can be reduced in scale and deformed by applying a pressure under a static water pressure.

Eighth Embodiment

The eighth embodiment of the present invention will be described with reference to a manufacturing device which forms a pattern on a process target.

The process target is processed in advance into a sheet-like shape, and is wound up with an end of the sheet fixed to a roller. The process target thus rolled is fed to the device. The sheet as the process target is conveyed by conveyor rollers. Stress applied to the sheet being conveyed is adjusted by changing friction forces between the sheet and the conveyor rollers or by changing circumferential speeds of the conveyor rollers. Thus, an extension amount of the sheet in a conveying direction can be changed. To extend a substrate in a perpendicular direction to the conveying direction in the same plane as the sheet, the sheet may be extended with end portions of the sheet in longer sides thereof fixed by a clamp. Alternatively, the sheet may be extended with protrusions of conveyor rollers or conveyance guides hooked on holes formed in both of the end portions in the longer sides of the sheet. Thus, the deformation rate is partially changed so that the sheet surface can be processed when the deformation rate of the sheet is greater than 1.

Figure 11:
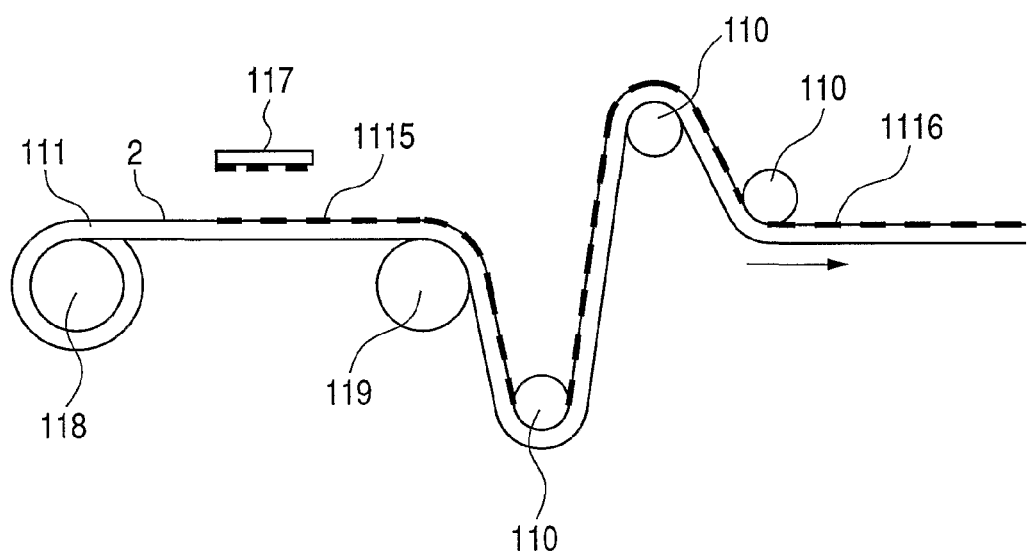
FIG. 11 depicts an exemplar configuration of a manufacturing device for forming a pattern on a process target, according to the example 10 of the present invention.

The manufacturing device in the above exemplar configuration will now be described with reference to FIG. 11. FIG. 11 is a cross-sectional view of a manufacturing device which forms a pattern on a process target.

The process target is processed into a rectangular sheet-like shape in advance. An end in shorter sides is fixed to a winding roller 118, and thereafter, the process target is wound up around the roller 118. The process target is fed to the manufacturing device from the winding roller 118. The conveying direction of the sheet-like process target 111 fed from the winding roller 118 is changed by a speed adjustment conveyor roller 119. Thereafter, the conveying direction is further changed by the conveyor roller 110 upon necessity.

If the circumferential speed of the speed adjustment conveyor roller 119 is increased higher than that of the sheet winding roller 118, stress can be applied to the process target 111 between the sheet winding roller 118 and speed adjustment conveyor roller 119 so as to extend the process target.

If the stress generated when the process target is extended between the sheet winding roller and speed adjustment conveyor roller is equal to friction forces between the speed adjustment conveyor roller and conveyor rollers and the process target, the respective rollers may have the same process target conveying speed.

If an elastomer is used for the process target, friction forces against the speed adjustment conveyor roller 119 and the conveyor rollers 110 are strengthened because the elastomer has high adhesion to many kinds of materials. Accordingly, the extension amount of the process target 111 can be adjusted relatively easily.

After the process target is extended between the sheet winding roller 118 and the speed adjustment conveyor roller 119, a pattern 1115 is formed on the process surface 2 according to the method described above.

The process target 111 which has passed through the speed adjustment conveyor roller 119 reduces stress by the conveyor rollers 110 upon necessity and is thereby brought into a force free state. A pattern 1116 in a force free state reduced in size when forming the pattern can thus be obtained on the surface of the process target. The diameter of each roller may be partially changed such that, whenever a roller contacts the process surface 2, the roller contacts only parts where patterns are not formed.

The process target is thereafter conveyed to a processing device in a next step, and is processed into a shape having a desired appearance by cutting or the like.

Ninth Embodiment

The ninth embodiment of the present invention will now be described with reference to an exemplar configuration in which a microstructure is manufactured on a surface of a process target in a manner as follows. In this embodiment, the process target made of an elastically deformable material is deformed at least in an inplane direction. A transfer pattern made of a material having higher elastic modulus than that of the process substrate is embedded inside the process target from a process surface. Further, the shape of the process target is changed close to a force free state, to change intervals between transfer patterns from those at the time of transfer. Thus, a microstructure is manufactured.

Figure 12A:
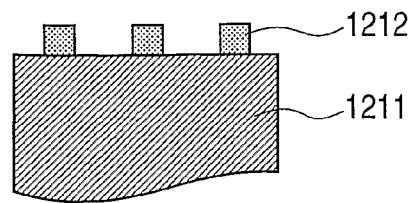
FIGS. 12A, 12B, 12C, 12D, 12E, 12F, and 12G depict an exemplar configuration according to the example 11 of the present invention, in which an elastically deformable material is shrunk after forming a pattern on the elastically deformable material.

Description will be made referring to FIGS. 12A to 12G. At first, as shown in FIG. 12A, a transfer pattern 1212 is formed on a substrate 1211. As a material forming the transfer pattern, a material having greater elastic modulus than that of an elastically deformable process target is used. The transfer pattern 1212 is embedded into the process target 1213 from a process surface 1214, and the pattern is transferred to the process surface 1214. When the shape of the process target 1213 is thereafter deformed, the deformation rate can be reduced due to the greater elastic modulus. That is, the deformation rate of the material forming the transfer pattern can be reduced smaller than the deformation rate of the process target. Accordingly, a micropattern having a desired size can thereby be formed easily on the surface of the process target.

Preferably, the deformation amount of the transfer pattern is remarkably small when the process target expands or shrinks. For example, when rubber is used for the process target 1213, a material having a greater Young's modulus compared with rubber can be used as a material forming the transfer pattern 1212, i.e., metal, semiconductor, oxide, plastic, and the like can be used. Any plastic material is usable as far as the plastic material has greater elastic modulus than the process target 1213. For example, multipurpose plastic such as vinyl chloride, polyethylene, polypropylene, or polystyrene, engineering plastic, super engineering plastic, and the like are usable. Since patterns can be easily made from plastic materials, various photosensitive resists may be used. Two or more of the materials cited above may be mixed in use, or different materials may be multi-layered in use.

Preferably, the pattern 1212 formed on the substrate 1211 is mechanically separable from the substrate 1211 or only the substrate 1211 can be selectively etched after transferring the pattern 1212. Materials for the easily mechanically separable substrate 1211 and pattern 1212 are preferably as follows. When the pattern 1212 is made of metal, plastic, semiconductor, or oxide is preferred as a material forming the surface of the substrate 1211. When the pattern 1212 is made of plastic, semiconductor, oxide, or metal is preferred as a material forming the surface of the substrate 1211. A mold release layer may be formed between the substrate 1211 and the pattern 1212. A combination which allows only the substrate 1211 to be selectively etched after transferring the pattern 1212 may be selected such that metal forming the pattern 1212 is less electrochemically soluble than metal forming the substrate 1211. For example, if a Pt pattern is created on a Cu substrate, only Cu can be selectively dissolved by use of sulfuric acid. However, the combination of materials forming the substrate 1211 and pattern 1212 are not limited to this. The substrate 1211 can be easily deformed such that the pattern 1212 can be easily peeled off from the substrate 1211.

As a method of forming the pattern 1212 on the surface of the substrate 1211, a metal pattern forming method based on lift off, etching, or pattern plating, or a resin pattern forming method based on coating, inkjet, or dry etching, or using a photosensitive material is available. When forming the pattern 1212, a thin film forming method such as sputtering, vapor deposition, plating, or coating, photolithography using ultraviolet or visible light, electron beam lithography, an ion beam, X-ray exposure, nanoimprint lithography, or the like is available. Alternatively, machine processing, a focused ion beam (FIB), wet etching, dry etching, or the like is available. Further alternatively, a transfer pattern may be manufactured with alumina nanoholes used as mold, which are pores obtained by anodic oxidation of aluminum, formed in a perpendicular direction to the substrate, and having a diameter of nanometer order. That is, a convex structure can be formed as a transfer pattern by dissolving alumina after filling the alumina nanoholes with resin or metal as described above.

Figure 12B:
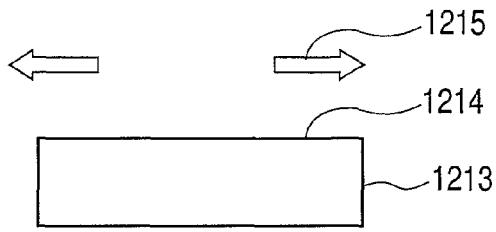
Figure 12C:
Figure 12D:
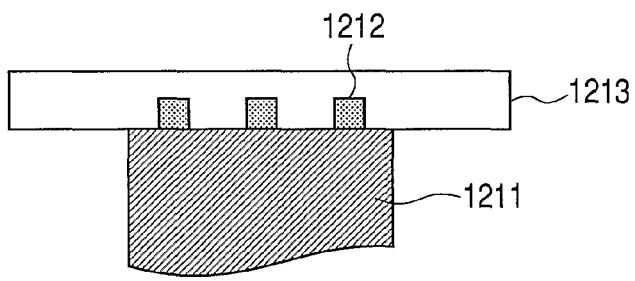
Figure 12E:
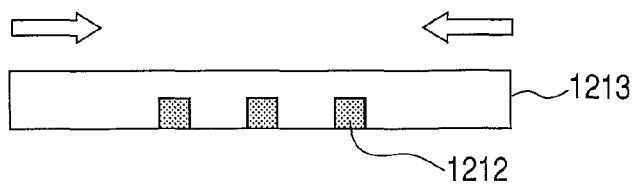
Figure 12F:
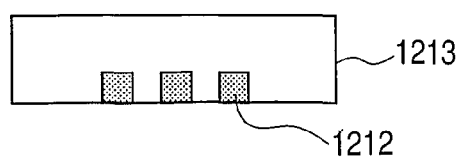
Figure 12G:
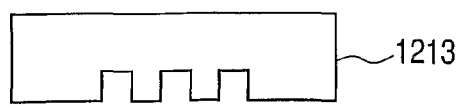

Next, as shown in FIG. 12B, the process target 1213 is extended uniformly in all inplane directions of a process surface 1214 and is kept thus extended, to obtain the process target after deformation, as shown in FIG. 12C. Next, as shown in FIG. 12D, the substrate 1211 with the transfer pattern 1212 formed above on the surface of the substrate 1211 and the process target 1213 are layered on each other. Pressure is applied from a direction perpendicular to the surface where the transfer pattern 1212 is formed. If the transfer pattern 1212 is sharp, the transfer pattern can be embedded inside the process target from the process surface 1214. In addition, when applying pressure, the transfer pattern may be heated and the process target may be cooled. Next, as shown in FIG. 12E, the substrate 1211 and the process target 1213 are separated from each other. A separation method thereof may be of mechanical peeling or selective dissolution of the substrate by dry or wet etching. Next, as shown in FIG. 12F, stress applied to the process target 1213 after transferring a pattern is adjusted to shrink the process target 1213. The stress may be removed to recover the same size as that before the process target was extended. Thereafter, rubber elasticity of the process target may be lowered by UV or electron beam irradiation, heating, or cooling. As a result of this, the transfer pattern 1212 is capable of changing pattern intervals, maintaining the shape. Thereafter, the transfer pattern may be removed by dry or wet etching upon necessity, as shown in FIG. 12G.

Figure 13A:
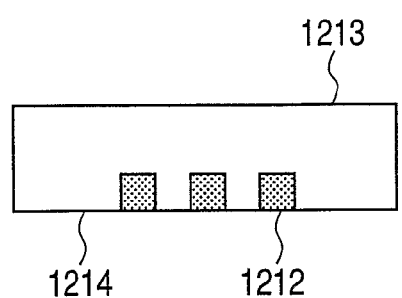
FIGS. 13A and 13B depict an exemplar configuration according to the eleventh embodiment of the present invention, in which a part of a process target is removed from a process surface.
Figure 13B:
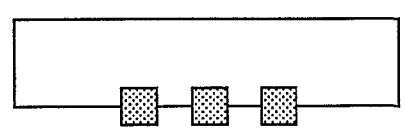
Figure 14A:
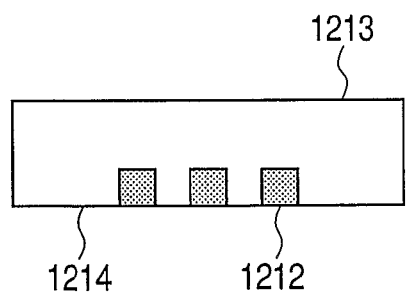
FIGS. 14A and 14B depict an exemplar configuration according to the eleventh embodiment of the present invention, in which at least a part of a transfer pattern is removed.
Figure 14B:
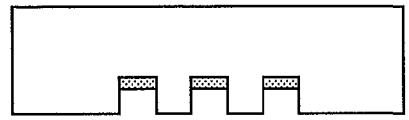

Further, as shown in FIGS. 14A and 14B, at least part of the transfer pattern 1212 may be removed. As a method for removing the transfer pattern 1212, wet or dry etching is available. In addition, part of the process target 1213 may be removed from the process surface 1214 as shown in FIGS. 13A and 13B. As a method for removing the transfer pattern, wet or dry etching is available as well.

Tenth Embodiment

The tenth embodiment of the present invention will be described with reference to an exemplar configuration in which a microstructure is manufactured on a surface of a process target. In this embodiment, a transfer pattern made of a material having greater elastic modulus than a material forming an elastically deformable process target is embedded inside the process target from a process surface. Further, the shape of the process target is extended or reduced to change intervals between transfer patterns from intervals at the time of transferring the patterns. Thus, a microstructure is manufactured on the surface of the process target.

Next, as an example thereof, description will be made of an exemplar configuration in which the process target is reduced after forming a pattern on an elastically deformable material. At first, like in the first embodiment, a transfer pattern is formed on a substrate. Next, the substrate having a surface on which the transfer pattern is formed and the process target are layered on each other. Pressure is applied from a direction perpendicular to a surface where the transfer pattern is formed. In this manner, the transfer pattern is embedded inside the process target from the process surface, and the transfer pattern and the process target are bonded to each other. In this case, a suitable material for the process target has elastic modulus which is as low as 1 to 20 MPa or so and is said to have rubber elasticity. Any material can be used as far as elastic deformation can be achieved. However, a material of elastomer series having a great deformation rate is preferred. Next, the process target after transferring the pattern is elastically deformed to be extended or shrunk at least in the same plane as the process surface. Next, stress applied to the process target after transferring the pattern is adjusted to extend or shrink the process target. Thereafter, the rubber elasticity of the process target may be lowered by UV or electron beam irradiation or heating or cooling. Thereafter, as shown in FIGS. 14A and 14B, at least part of the transfer pattern may be removed. As a method for removing the transfer pattern, wet or dry etching is available. Further, part of the process target may be removed from the process surface as shown in FIGS. 13A and 13B. As a method for removing the transfer pattern, wet or dry etching is available as well.

Eleventh Embodiment

The eleventh embodiment of the present invention will be described with reference to an exemplar configuration in which a microstructure is manufactured on a surface of a process target. In this embodiment, a transfer pattern made of a material having greater elastic modulus than a material forming a plastically deformable process target is embedded inside the process target from a process surface. Further, the shape of the process target is extended or reduced to change intervals between transfer patterns from intervals at the time of transferring the patterns. Thus, a microstructure is manufactured on the surface of the process target.

At first, like in the tenth embodiment, a transfer pattern is formed on a substrate. Next, the substrate having a surface on which the transfer pattern is formed and the process target are layered on each other. Pressure is applied from a direction perpendicular to a surface where the transfer pattern is formed. The transfer pattern is embedded inside the process target from the surface of the process target. If the transfer pattern is sharp, the transfer pattern can be embedded easily inside the process target. Next, the substrate having a surface where the transfer pattern is formed and the process target are separated from each other. A separation method thereof may be of mechanical peeling or selective dissolution of the substrate by dry or wet etching. Thereafter, the process target to which the pattern has been transferred is applied with a force which causes the process target to shrink, thereby to effect plastic deformation. Thus, the process target after deformation is obtained. To cause uniform compression by plastic deformation, for example, there is a method as follows. That is, a plastically deformable material is formed on an elastically deformable material. The elastically deformable material is shrunk, thereby causing accordingly shrinkage of the plastically deformable material. There is another method in which pressure is uniformly applied to a process target by air pressure or liquid pressure. Thus, the pattern interval can be changed, maintaining the shape of the transfer pattern.

Thereafter, the transfer pattern may be removed by dry or wet etching upon necessity. That is, part of the process target may be removed from the process surface as shown in FIGS. 13A and 13B. As a method for removing the transfer pattern, wet or dry etching is available. Further, as shown in FIGS. 14A and 14B, at least part of the transfer pattern may be removed. As a method for removing the transfer pattern, wet or dry etching is available as well.

Twelfth Embodiment

The twelfth embodiment of the present invention will now be described with reference to an exemplar configuration in which a structure having a micro-pattern is manufactured as follows. That is, a process substrate made of an elastically deformable material is repeatedly extended and shrunk. A pattern is formed on a surface of the process substrate every time when the substrate is extended or shrunk. See FIGS. 17A to 17I.

Figure 17A:
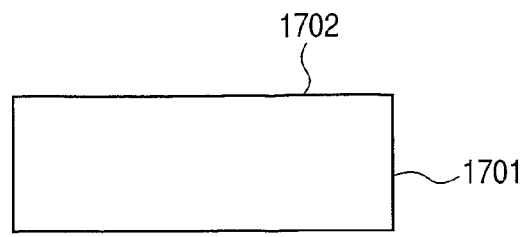
FIGS. 17A, 17B, 17C, 17D, 17E, 17F, 17G, 17H, and 17I are views for depicting the present invention.
Figure 17B:
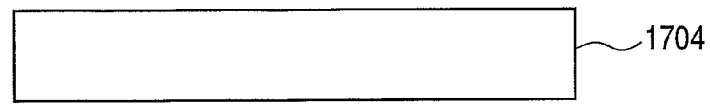

As shown in FIGS. 17A and 17B, an elastically deformable process substrate 1701 is extended in an inplane direction in the same plane as the substrate surface. After extending the process substrate, a pattern 1707 made of a material A having higher elastic modulus than the process substrate 1701 is formed on a process surface 1702, like in the sixth embodiment.

Figure 17C:
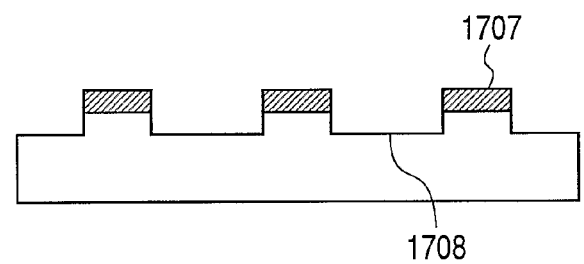

Next, the process substrate 1701 is etched to manufacture a depression structure 1708 (FIG. 17C). For example, a film made of the material A is formed on the whole surfaces of the process substrate 1701 having a flat shape. Using a desired mask, the film made of the material A and the process substrate are etched.

Figure 17D:
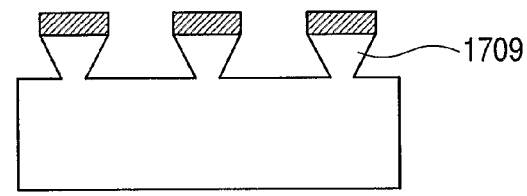

Next, the extension force is unloaded or weakened to reduce the deformation rate to be smaller than that at the time of forming a pattern (FIG. 17D). Since the material forming the pattern 1707 formed on the process surface 1702 has higher elastic modulus than the process substrate 1701, parts contacting the pattern 1707 shrink by a smaller shrink amount. As a result of this, the cross-sectional shape of a projecting structure 1709 formed on the process surface 1702 has an inverted tapered shape.

Figure 17E:
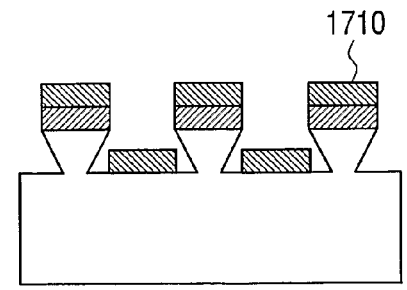
Figure 17F:
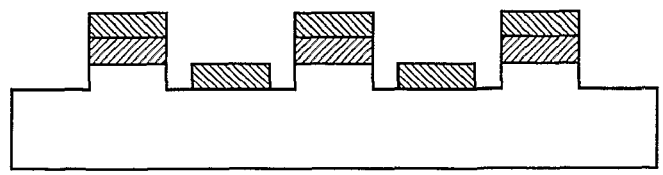

Next, while maintaining the cross-sectional shape of the inverted tapered shape, a film made of a second material B having higher elastic modulus than the process substrate 1701 is formed on the process substrate 1701. When the film of material B is formed, preferably, the material B is not applied to side surfaces of the projecting structure 1709 having an inverted tapered shape (FIG. 17E). Note that the material A may be the same as the material B.

Figure 17G:
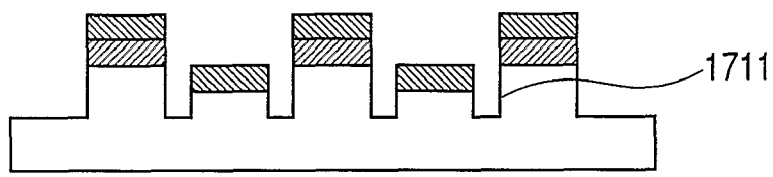

Thereafter, the process substrate 1701 is extended (FIG. 17F), and second etching is effected on the process surface 1702, to form a depression structure 1711 (FIG. 17G). After this etching, the pattern formed on the surface is removed, and the extension of the process substrate is released. In this manner, an asperity pattern at a shorter pitch than the pattern 1707 shown in FIG. 17C formed on the surface of the process substrate is obtained.

Alternatively, after forming the film of the material B on the surface of the projecting structure 1709 having an inverted tapered shape and extending the process substrate 1701 (FIG. 17F), the material A and the material B on the material A may be peeled. Then, the process substrate may be etched. If a speed at which the projecting structure 1709 formed by the first etching is removed by the etching is equal to a speed at which the material B a film of which has been formed is removed, a top end portion of a projecting structure obtained after the second etching is formed in the same plane.

Metal substances are peeled after forming a metal layer on the process surface 1702 where the asperity structure is formed according to the method described above. Thus, a structure 1712 to which the asperity structure of the process surface is transferred can be obtained.

Thirteenth Embodiment: Fourth or Fifth Invention

Another method for manufacturing a structure having a pattern according to the present invention will now be described. More specifically, the method includes at least three steps below. Step 1: an elastically deformed flat process target having a pattern made of a projecting structure is prepared. In this step 1, the flat process target is prepared by any of methods described in the foregoing embodiments or by a different method not limited to those embodiments. Step 2: the flat process target is etched using the pattern as a mask. Through this step, a predetermined pattern is formed on the flat process target. Step 3: an elastically deformed state of the flat member is loosened after etching the flat process target. The elastically deformed state of the flat process target may be perfectly returned to an original state or may stay in a stage loosened to a certain extent. The steps 2 and 3 may be carried out in reverse order.

Fourteenth Embodiment: Sixth Invention

A method of manufacturing a structure having a pattern according to the present embodiment is characterized by including steps below. Step 1: a first process target having a pattern constituted by including a depression is prepared. Step 2: the first process target is deformed to be reduced in size; and the first process target in the reduced state is used to transfer to the second process target the pattern which the first process target has in the reduced state. In this stage, a target to which the pattern of the first process target is to be transferred is metal, resin, or the like. More specifically, the transfer is achieved by effecting sputtering, vapor deposition, plating, spin coating, dip coating, coating, or the like on the pattern kept in the reduced state which the first process target has.

EXAMPLES

Examples of the present invention will now be described below.

Example 1

The example 1 of the present invention will be described with reference to a method for manufacturing a structure having a nanoscale pattern, combining uniform extension in all directions of a substrate and pattern drawing technology. FIGS. 1A to 1D depict an exemplar configuration in which a pattern is formed on a process substrate uniformly extended in all inplane directions and a force free state before extension is then recovered, to form a reduced pattern shape. In FIGS. 1A to 1D, 1001 denotes a process substrate in a force free state, and 1002 denotes a process surface. 1003 denotes a direction of deformation, and 1004 denotes the process substrate after deformation. 1005 denotes a pattern formed with the process substrate kept in a deformed state. 1006 denotes a pattern shape in a state in which the process substrate is returned to a force free state before extension after forming the pattern. In the present embodiment, a polymer consisting of styrene-isoprene that is a thermoplastic elastomer is used as the process substrate 1001 made of an elastically deformable material. Available as this polymer, for example, is Quintac® manufactured by ZEON CORPORATION, Qualatex® manufactured by U.S. PIONEER ELECTRONICS CORPORATION as thermoplastic elastomer consisting of another kind of polymer, or the like. This material has rubber elasticity at room temperature and is gradually softened to become like honey as the temperature exceeds 100° C. For example, if styrene-isoprene is shaped into a sheet having a thickness of 100 μm and a diameter of 3 cm and is tensioned in an inplane direction, the sheet is extended 10 times or more longer. If the tension is unloaded, the sheet recovers an original shape. If density inside the sheet, thickness thereof, and ambient temperature distribution are uniform, the shape of the sheet changes uniformly in extension directions.

Next, manufacturing process thereof will be described with reference to FIGS. 1A to 1D. At first, one surface of a sheet is taken as a process surface 1002 (FIG. 1A). A force directed as indicated by deformation directions 1003 is applied mechanically, to extend the surface uniformly in all inplane directions to attain a deformation rate of 500%. This state is maintained intact (step (1) in FIG. 1B). This is taken as a process substrate 1004 after deformation. Next, a pattern 1005 is formed by ion beam lithography on the process surface 1002 of the process substrate 1004 after deformation (step (2) in FIG. 1C). In this example, a depression structure having a line pattern (1 μm×3 mm rectangles are arrayed at a pitch of 2 μm) and a dot pattern (dots having a 1 μm diameter are arrayed at a pitch of 2 μm) is formed. At this time, if drifting occurs on the surface, patterns are processed cooled by liquid nitrogen or the like. Alternatively, pressing is carried out at room temperature with use of a mold made of fluorine resin by a nanoimprint method, to manufacture similar patterns. According to the nanoimprint method, patterns can be created all at once, so that the process substrate need not be cooled. Next, the extension force is unloaded so that a shape before extension is recovered (step (3) in FIG. 1D). Thus, as shown in FIG. 1D, the pattern shape 1006 in a force free state is recovered. At this time, the deformation rate may be returned to 200%, and the process target may be used intactly at this rate. If the extension force is unloaded perfectly, a written pattern has a shape uniformly reduced in scale in all inplane directions. The pitch of the line pattern is 1/5 smaller than the written pattern. In addition, the depth is reduced. Thus, a smaller pattern than a pattern written by ion beam lithography can be obtained.

On the contrary to the exemplar configuration described above, an enlarged pattern shape may be formed.

FIGS. 2A to 2C depict an exemplar configuration in which a pattern is formed on a process substrate in a force free state and the process substrate is thereafter extended uniformly in all inplane directions, to form an enlarged pattern. In FIGS. 2A to 2C, 2001 denotes a process substrate in a force free state, and 2002 denotes a process surface. 2003 denotes a direction of deformation, and 2004 denotes the process substrate after deformation. 2005 denotes a pattern formed with the process substrate kept in a force free state. 2006 denotes a pattern shape in a state in which the process substrate is extended uniformly in all inplane directions after forming the pattern. As shown in FIGS. 2A to 2C, the pattern 2005 can be first formed on the process surface 2002 in a force free state (FIG. 2A). Thereafter, extension uniformly in all inplane directions can be carried out to obtain an enlarged pattern shape 2006 (FIG. 2C).

Example 2

The example 2 of the present invention will be described with reference to an exemplar configuration using air pressure in contrast to the example 1 using mechanical extension to extend the process substrate 1001 made of an elastically deformable material. The present example is configured so as to perform extension by use of air pressure in the step (1) shown in FIG. 1B. At this time, a back surface opposite the process surface is sealed with a rubber-made O-ring, to raise air pressure on the back side to be higher compared with air pressure on the surface side. In this manner, the sheet of the process substrate 1001 is pushed and extended to the surface side. In this case, the extension depends on thickness distribution of the process substrate 1001. A thin portion is extended more in the inplane directions of the process surface as compared with a thick portion. Hence, sheet density and thickness are preferably formed uniform.

Example 3

Figure 3D:
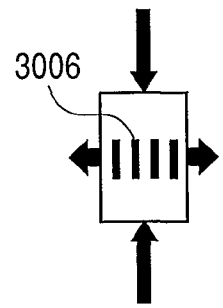

The example 3 of the present invention will be described with reference to an exemplar configuration which combines extension in longitudinal directions of a substrate, reduction in lateral directions thereof, and pattern drawing technology. FIGS. 3A to 3D depict an exemplar configuration in which a pattern is formed on a process substrate extended in longitudinal directions and reduced in lateral directions and the substrate is returned to a force free state before extension, to form a pattern reduced in scale. The same components of the configuration as those shown in FIGS. 1A to 1D are denoted at the same reference symbols (but the digit of thousand), and reiterative description of overlapping parts will be omitted herefrom. Next, manufacturing process thereof will be described with reference to FIGS. 3A to 3D. At first, a sheet having a 1 cm×3 cm size and a 100 μm thickness is manufactured using the same material as that in the example 1 (FIG. 3A). This is called a process substrate 3001. Assume that the 1 cm side is put in parallel to the X direction and the other 3 cm side is put in parallel to the Y direction. One surface of the sheet is taken as a process surface 3002. Mechanical extension is performed such that the sheet becomes 5 times longer in the Y direction (at a deformation rate of 500%) as shown in FIG. 3B. As the shape is deformed, a central portion of the sheet shrinks in the X direction. This is taken as a process substrate 3004 after deformation. Like in the example 1, a pattern 3005 is formed on a process surface of the process substrate 3004 after deformation (FIG. 3C). A force free state is then recovered by unloading (FIG. 3D). In this manner, a pattern shape 3006 is obtained reduced 1/5 time in the Y direction and enlarged in the X direction.

Example 4

Figure 4A:
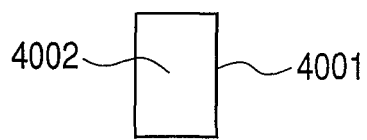
FIGS. 4A, 4B, 4C, and 4D are schematic cross-sectional views for depicting the present invention.
Figure 4B:
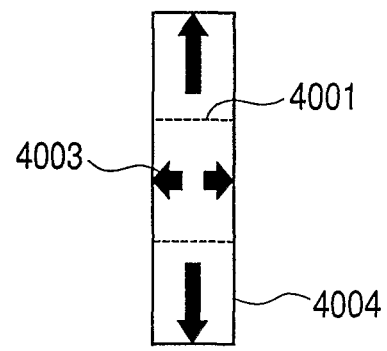
Figure 4C:
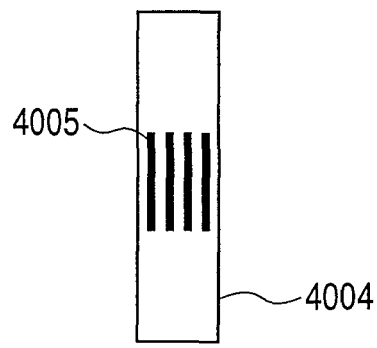
Figure 4D:
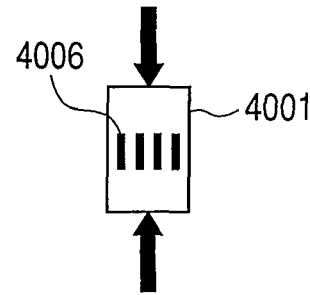

The example 4 of the present invention will be described with reference to an exemplar configuration which combines uniaxial extension in longitudinal directions of a substrate, slight extension in lateral directions thereof, and pattern drawing technology. FIGS. 4A to 4D depict an exemplar configuration in which a pattern is formed on a process substrate uniaxially extended in longitudinal directions and slightly extended in lateral directions and the substrate is returned to a force free state before extension, to form a pattern shape reduced in scale. The same components of the configuration as those shown in FIGS. 3A to 3D are denoted at reference symbols having the same numerals in the lowest digit as those in FIGS. 3A to 3D, and reiterative description of overlapping parts will be omitted herefrom. Next, a manufacturing process thereof will be described with reference to FIGS. 4A to 4D. In the present example, a similar process substrate 4001 to the process substrate in the example 3 is used (FIG. 4A). Since mechanical extension is performed only in the Y direction in the example 3, the pattern shape shrinks in the X direction. In contrast, where the pattern shape should desirably be shrunk along only one axis, extension equivalent to shrinkage in the X direction is needed to prevent the shrinkage in the X direction. Therefore, load in directions 4003 of displacement is applied so that the substrate is extended only in the Y direction, in a process surface 4002 near an area where a pattern is formed. The substrate is thus slightly extended in lateral directions (FIG. 4B). This is taken as a process substrate 4004 after deformation. Like in FIG. 3C, a pattern 4005 is formed on the process surface of the process substrate 4004 after deformation (FIG. 4C), which is returned to a force free state by unloading (FIG. 4D). In this manner, a pattern shape 4006 which is shrunk in the Y direction and not shrunk or enlarged in the X direction can be obtained.

Example 5

The example 5 of the present invention will be described with reference to an exemplar configuration in which a sphere made of acrylic resin is used as a process target made of a plastically deformable material. FIGS. 5A to 5C show the exemplar configuration in which a sphere made of acrylic resin is used as a process target made of a plastically deformable material, according to this example. Those components of the configuration that has basically the same functions as those shown in FIGS. 2A to 2C are denoted at reference symbols having the same numerals in the lowest digit as those in FIGS. 2A to 2C, and reiterative description of overlapping parts will be omitted herefrom.

Next, with reference to FIGS. 5A to 5C, manufacturing process thereof will be described. In the present example, a spherical substrate made of an acrylic resin is used as a process substrate 5001 made of a plastically deformable material. The sphere has a diameter of 1 cm. Preferably, the density of the process substrate (spherical substrate) 5001 and the shape of the sphere are uniform (FIG. 5A).

Next, a part on the spherical substrate 5001 is taken as a process surface 5002, and a pattern 5005 is formed thereon (FIG. 5B). A concave spherical mold made of Ni is used. This mold is heated to 160° C. and pressed to the acrylic surface. Pattern forming is carried out by a nanoimprint method. A pattern 5005 to be formed is constituted by a concave line-and-space structure and a hole structure at a pitch of 100 nm. Both structures are 50 nm deep.

Next, this is set in a water tank of a static water pressure press machine. Pressure is applied uniformly to surfaces. The pressure is increased gradually so as to cause uniform compression due to plastic deformation. A pattern forming area is very small compared with the size of the sphere and therefore does not substantially influence the uniform compression. In this manner, a pattern shape 5006 can be obtained, uniformly reduced in scale in all directions (FIG. 5C).

Example 6

Figure 6A:
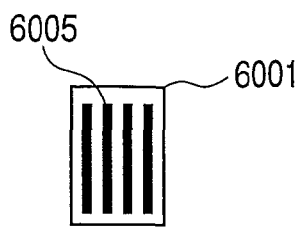
FIGS. 6A and 6B are schematic cross-sectional views for depicting the present invention.
Figure 6B:
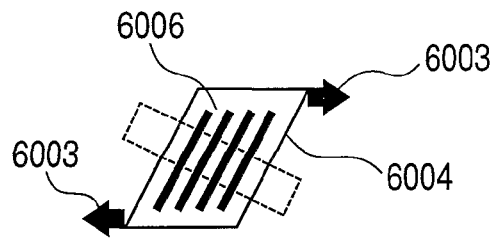

The example 6 of the present invention will be described with reference to an exemplar configuration in which a pattern array is changed by deformation directions based on mechanical load applied to a process substrate. FIGS. 6A and 6B show an exemplar configuration in which a pitch and a width are both reduced by deformation directions of mechanical load applied to a process substrate. The same components of the configuration as those shown in FIGS. 3A to 3D are denoted at the same reference symbols in the lowest digit as those in FIGS. 3A to 3D, and reiterative description of overlapping parts will be omitted herefrom.

Next, with reference to FIGS. 6A and 6B, manufacturing process thereof will be described. In this example, an elastic sheet similar to that in the example 3 is used as a process substrate 1. A part of a sheet surface is taken appropriately as a process surface 6001, and a pattern 6005 is formed by ion beam lithography. A line-and-space pattern having a pitch of 200 nm and a depth of 100 nm is formed (FIG. 6A). Load is mechanically applied in arrow directions 6003 in FIG. 6B. Then, the part is shaped substantially like a parallelogram. Accordingly, the pattern of lines arrayed in parallel has a line pattern shape 6006 of lines arrayed in parallel as in a part indicated by broken lines. Thus, the pitch and width can both be reduced.

Figure 7A:
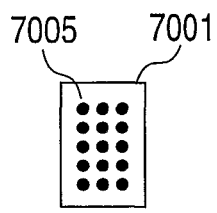
FIGS. 7A and 7B depict an exemplar configuration according to the example 6 of the present invention, in which a pattern arrayed like a square lattice is rearranged like a triangular lattice by directions of deformation based on mechanical load applied to a process substrate.
Figure 7B:
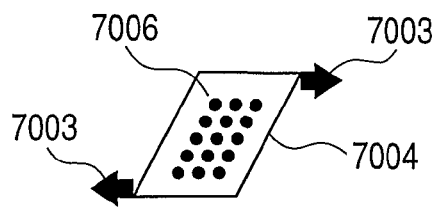

Alternatively, where configured as shown in FIGS. 7A and 7B, a pattern arrayed like a square lattice can be rearranged into an array like a triangular lattice. Manufacturing process thereof will be described with reference to FIGS. 7A and 7B. A hole structure 7005 having holes arrayed like a square lattice, which has a 200 nm pitch and a 100 nm depth, is formed on a process substrate 7001 similar to the process substrate in the example 3 (FIG. 7A). Load is mechanically applied in arrow directions 7003 in FIG. 7B. At this time, a pattern shape 7006 in which the pattern once arrayed like a square lattice is rearranged into an array like a triangular lattice can be obtained by adjusting the load. If a beam having equal performance is used in electron beam lithography or the like, a triangular lattice array is difficult to manufacture as compared with a square lattice array. This problems can be eliminated. In this case, the hole shape may be deformed to be slightly elliptic depending on extension directions of the substrate.

Example 7

The example 7 of the present invention will be described with reference to an exemplar configuration in which a separate pattern made of a material different from that of a process substrate is formed on the process substrate, and the process substrate is reduced in scale to form a pattern shape. FIGS. 8A to 8D depict an exemplar configuration of the present example.

At first, for example, uniaxially extended PET sheet (500 nm thick) is taken as a process substrate 8001 (FIGS. 8A and 8B). Next, a pattern constituted by arrayed five separate patterns 8005 made of photoresist, each of which has a 10 μm square size and a 10 μm height, is formed on the PET at a pitch of 50 nm by transfer from another substrate (FIG. 8C). The photoresist used here has elastic modulus higher than that of the PET sheet. In this case, preferably, the photoresist pattern is not softened at heating temperature thereof.

Next, the PET sheet is heated at temperature not higher than transition temperature of glass. Then, shrinkage starts in the axial direction of the extension. When intervals reach 30 μm, heating/shrinkage is terminated, and cooling is performed. A micropattern can then be obtained (FIG. 8D). The intervals between photoresist patterns are narrowed as the sheet shrinks. However, the shape of the pattern itself does not change and the contact area contacting the PET sheet stays unchanged. In other words, the ratio of pattern length A1 (10 μm before shrinkage) to interval length B1 (50 μm before shrinkage) in a cross section penetrating the pattern in the extension direction is increased by shrinkage, i.e., (A1/B1)< (A1'/B1') where A1' and B1' are pattern length and interval length after shrinkage, respectively.

In this example, a sheet made of styrene-isoprene polymer as an elastic material in the example 1 may be used. In this case, at first, a process substrate is extended in a plane so as to have a size increased in a uniaxial direction (FIG. 8B). Thereafter, a pattern is formed at an upper portion (FIG. 8C), and the deformation rate is decreased. When the intervals reach 30 μm, the rate may be fixed (FIG. 8D).

Example 8

The example 8 of the present invention will be described with reference to an exemplar configuration. In the exemplar configuration, a pattern-forming layer 7 made of a material different from that of a process substrate is formed on the process substrate, and a pattern is formed after extending the process substrate by elastic deformation. Elastic deformation is effected again to cause shrinkage to form a pattern shape. FIGS. 9A to 9E depict an exemplar configuration of this example.

At first, for example, a sheet made of silicone rubber which is an elastic material similar to that in the example 1 is manufactured as a process substrate 9001 (FIG. 9A). The sheet has a size of 3 mm×5 mm and a thickness of 500 μm.

Next, a styrene-isoprene polymer appropriately diluted in a dilute solution is spin-coated on the sheet, and is baked at 60° C. to volatilize the solution, to form a pattern-forming layer 9007 having a thickness of 1 μm (FIG. 9B). This is extended in an inplane direction by elastic deformation (FIG. 9C). Maintaining this extended state, a pattern is formed out by pressing of a mold to the styrene-isoprene layer 9007. At this time, the styrene-isoprene layer 9007 becomes thinner than before extension. The mold is made of Si having a structure in which cubic projecting structures each having a size of 10 μm square×10 μm height are arrayed on a flat surface at intervals of 50 μm. The mold is heated to 100° C. Further, pressure of 10 kg/cm$^2$ is applied to perform imprinting. Corresponding depression structures are formed in the surface of the styrene-isoprene layer (FIG. 9D).

Figure 9E:
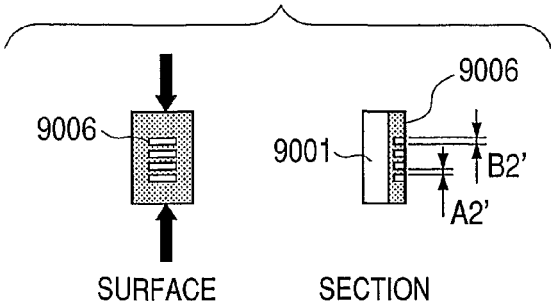

Next, the extension is released to attain a size substantially equal to the sheet size after formation of the styrene-isoprene layer. A pattern-forming layer used in this case has elastic modulus substantially equal to that of the process substrate. Therefore, the pattern-forming layer is returned to an initial force free state merely by releasing the extension. That is, the contact area of a layer tightly contacting with respect to the styrene-isoprene layer and the silicone rubber changes similarly to the other areas. The pattern 9006 after formation has a smaller size in the extended direction, i.e., 5 μm×10 μm and a depth of 10 μm (FIG. 9E). The shape of the bottom portion of the pattern 9006 has a shape like a hole and slightly protrudes. Thereafter, a residual film of styrene-isoprene may be removed from the bottom portion of the pattern 9006 by dry etching upon necessity.

Example 9

The example 9 of the present invention will be described with reference to an exemplar configuration in which a roller mold is used when a pattern is formed on a pattern-forming layer or a process surface. FIGS. 10A and 10B depict an exemplar configuration of this example. A sheet 2210 made of a styrene-isoprene polymer is used as a process target. A sheet having a thickness of 1 mm and a width of 20 mm is used. Like in a flat method as a general method for manufacturing an extended molded film made of plastic, a sheet is made flow on a belt. A mechanism for manufacturing a sheet from a lump of styrene-isoprene polymer may be included in combination with a T-die method.

While being conveyed, the sheet passes below a roller mold 2208. The roller mold 2208 is made of Ni and has projecting structures arrayed like a square lattice at a pitch of 500 nm on a surface of a curved face thereof. Each projecting structure has a shape having a diameter of 100 nm and a height of 200 nm. The roller mold 2208 is heated to 80° C. to transfer a pattern to a surface of styrene-isoprene by thermal imprinting. In addition, pressure of 10 kg/cm$^2$ is applied to the sheet surface from the roller mold. Like in the flat method, both ends of the sheet is fixed, at an extension area 2209 below and near the roller mold 2208. Extension is effected in a plane of the sheet and in a perpendicular direction to a flowing direction of the sheet, to increase the sheet width. In this state, the pattern is transferred by rotating the roller mold pressed. Thereafter, the extension of the sheet is released to return the width to an original force free state. In this manner, sequential patterns can be formed on the surface of the styrene-isoprene polymer, with the patterns reduced in scale in extended directions to be smaller than the pattern size on the surface of the roller mold. In this example, extension may also be effected simultaneously in the flowing direction of the sheet, to perform biaxial extension. As a result, patterns can be obtained reduced in scale in biaxial directions.

Example 10

The example 10 of the present invention will be described with reference to an exemplar configuration of a manufacturing device for forming a pattern on a process target. FIG. 11 depicts an exemplar configuration of the manufacturing device for forming a pattern on a process target, according to this example. Available as a process target 111 is a sheet having a width of 30 cm and a length of 10 m and made of thermoplastic elastomer as polymer consisting of styrene-isoprene. Quintac® manufactured by ZEON CORPORATION previously mentioned is available as the polymer consisting of styrene-isoprene. The Quintac® can be supplied for the manufacturing device from a winding roller 118. The Quintac® sheet is conveyed by rollers. Stress is applied between the winding roller 118 and a speed adjustment roller 119, and magnification rate of the sheet in the conveying direction is set to 150% relative to the sheet in a force free state. Thermal nanoimprinting is carried out with use of a silicon-made mold 117 in which lines each being 2 μm wide are formed at a pitch of 6 μm, to form a pattern 1115 on the surface of the Quintac®. Thereafter, stress to the sheet is reduced between the speed adjustment conveyor roller 119 and conveyor rollers 110 behind the roller 119, to recover a force free state. Thus, the pitch of patterns 1116 formed on the surface of the Quintac® sheet becomes 2/3 of the pitch at the time of forming the patterns.

Example 11

The example 11 of the present invention will be described with reference to an exemplar configuration in which a pattern is formed after extending uniformly an elastically deformable material in all directions and a shape before the extension is recovered. FIGS. 12A to 12G depict an exemplar configuration according to this example. At first, as shown in FIG. 12A, a silicon wafer is used as a substrate 1211 for manufacture of a transfer pattern. Resist is spin-coated on the silicon wafer. By exposure/development, openings each having a diameter of 500 nm are formed arrayed at a pitch of 4 μm like a square lattice. Thereafter, a film of copper is formed with a thickness of 500 nm, and the resist is then peeled. In this manner, circular columnar patterns each having a diameter of 500 nm and a height of 500 nm are formed as a transfer pattern 1212 at the pitch of 4 μm on the silicon wafer.

Next, polymer consisting of styrene-isoprene which is thermoplastic elastomer as an elastically deformable material is used as a process substrate 1213. For example, Quintac® manufactured by ZEON CORPORATION is available. This material has rubber elasticity at room temperature and is gradually softened to become like honey as the temperature exceeds 100° C. This styrene-isoprene copolymer is molded like a sheet which is 0.2 mm thick (FIG. 12B). If this is applied with a force which is uniform in all horizontal directions, extension is possible up to 1000% or so at most. Hence, the styrene-isoprene copolymer is extended at a magnification rate of 200% as shown in FIG. 12C, and thereafter, an Si wafer having a surface on which the columnar patterns are formed is hot-pressed as shown in FIG. 12D.

When pressing the wafer, the pressing is performed such that the columnar patterns contact the styrene-isoprene copolymer. The Si wafer is cooled to room temperature, and thereafter, the Si wafer is peeled from the styrene-isoprene copolymer. After the wafer is peeled, only circular bottom faces are exposed since the columnar patterns have already embedded inside the styrene-isoprene copolymer. Thereafter, load to the styrene-isoprene copolymer is released to attain a force free state (FIG. 12E). In this manner, the columnar copper patterns inside the styrene-isoprene copolymer have a pitch of 50% while maintaining the diameter of 500 nm and height of 500 nm (FIG. 12F). Subsequently, the styrene-isoprene copolymer in which the columnar copper patterns are embedded is dipped in 10% diluted hydrochloric acid for 20 seconds to dissolve copper. Thus, pores each having the diameter of 500 nm and depth of 500 nm are formed at the pitch of 2 µm (FIG. 12G).

Example 12

The example 12 of the present invention will be described with reference to an exemplar configuration in which an elastically deformable material is shrunk after forming a pattern on the elastically deformable material. By a similar method to that in the example 11, Ni line patterns each having a width of 1 µm, height of 500 nm, and length of 1 mm are formed on a silicon wafer at a pitch of 4 µm in a 1 mm square area. Polymer consisting of styrene-isoprene which is thermoplastic elastomer as an elastically deformable material is used as a process substrate. This styrene-isoprene copolymer is molded at 5 mm square to have a thickness of 10 mm. An Si wafer having a surface on which the line patterns are formed is hot-pressed to a surface of the styrene-isoprene copolymer. At this time, the line patterns are situated in contact with the styrene-isoprene copolymer. After cooling to room temperature, the styrene-isoprene copolymer is peeled from the Si wafer. The line patterns are thereby transferred to the styrene-isoprene copolymer. Thereafter, load is applied from sides of the styrene-isoprene copolymer such that the length of the styrene-isoprene copolymer in the compression direction is reduced at a deformation rate of 50%. In this manner, lines made of resist are embedded in the styrene-isoprene copolymer. The Ni lines each have the width of 1 µm and height of 500 nm. The pitch of the Ni lines is reduced to 2 µm, i.e., 50% of that at the time of forming the lines.

FIG. 13A shows a cross-section of the process substrate after deformation. As shown in FIG. 13B, a Ni protruding structure is formed by selectively dry-etching the styrene-isoprene copolymer. FIG. 14A shows a cross-section of the substrate after deformation. Pores having bottom portions made of Ni as shown in FIG. 14B are formed by dipping in 20 wt % sulfuric acid.

Example 13

The example 13 of the present invention will be described with reference to an exemplar configuration in which a plastically deformable material is shrunk after forming a pattern on the plastically deformable material. FIGS. 15A to 15F depict an exemplar configuration according to this example.

Figure 15A:
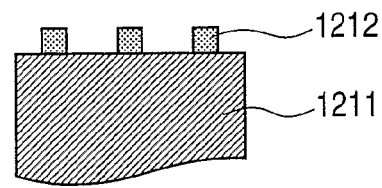
FIGS. 15A, 15B, 15C, 15D, 15E, and 15F depict an exemplar configuration according to the example 13 of the present invention, in which a plastically deformable material is shrunk after forming a pattern on the plastically deformable material.
Figure 15B:
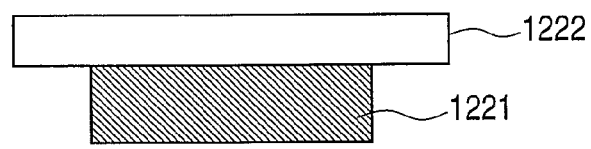
Figure 15C:
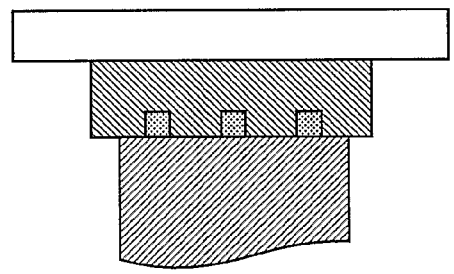
Figure 15D:
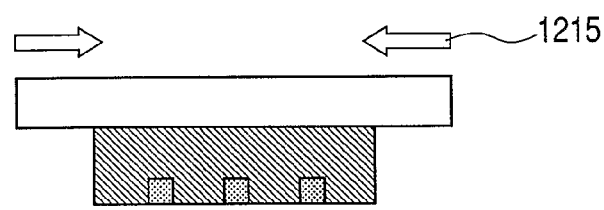
Figure 15E:
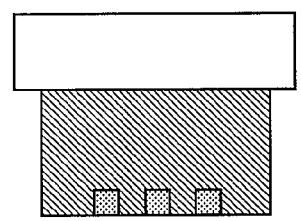
Figure 15F:
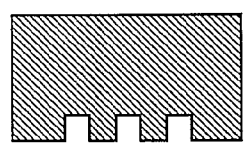

At first, by a similar method to that in the example 11, columnar patterns each having a diameter of 500 nm and height of 500 nm are formed at a pitch of 4 µm, as a transfer pattern 1212 on a silicon wafer (FIG. 15A). A silicone rubber sheet 1222 as an elastically deformable material on which polymethyl methacrylate (PMMA) as a plastically deformable material is formed is used as a process target 1221. Next, PMMA-silicone rubber multi-layer film is extended at temperature at which PMMA is liquid and silicone rubber can maintain its own shape and physical properties. PMMA has a melting point of 160° C. or so, and silicone rubber has an allowable temperature limit of 300° C. or so. Therefore, after heating the process target at 180° C., the multi-layer film is extended in uniaxial directions so as to reach 200% (FIG. 15B). Thereafter, the Si wafer having a surface on which the columnar patterns are formed is hot-pressed to the extended PMMA-silicone rubber multi-layer film. At this time, pressing is performed such that the columnar patterns contact the PMMA-silicone rubber multi-layer film (FIG. 15C).

After cooling to room temperature, the Si wafer is peeled from the process target. The columnar patterns are thereby transferred to polymethyl methacrylate. Thereafter, load to the process target is released to attain a force free state. PMMA is thereby compressed to a deformation rate of 50%. In this manner, columnar copper patterns each having the diameter of 500 nm and height of 500 nm are formed at the pitch of 2 µm in the compression direction, embedded in PMMA. Thereafter, copper is dissolved by dipping in 10% diluted hydrochloric acid for 20 seconds. Thus, pores each having a diameter of 500 nm are formed in a surface of PMMA at a pitch of 2 µm in the compression direction.

Example 14

The example 14 of the present invention will be described with reference to an exemplar configuration in which a pattern is formed by use of an elastically deformable liquid material after hardening and the elastically deformable material is shrunk thereafter. Resist is spin-coated on a silicon wafer, and openings each having a diameter of 80 nm are formed by exposure/development. Thereafter, films of platinum and nickel are formed orderly with thickness of 5 nm and 25 nm, respectively, by sputtering. Thereafter, the resist is peeled. In this manner, columnar patterns each having a diameter of 80 nm and height of 30 nm are formed on a silicon wafer at a pitch of 300 nm. Portions of the columns to 10 nm from tops thereof are made of platinum.

Next, a film of liquid silicone rubber is formed on an isoprene rubber sheet. As the liquid silicone rubber, Sylgard 184 Silicone Elastmer manufactured by DOW CORNING TORAY CO. LTD. or the like is available. A film of liquid silicone rubber is formed on an isoprene rubber sheet molded like a film. Before hardening, the isoprene rubber sheet is extended uniformly in all directions to be 1.5 times longer than that in a force free state. Thereafter, the silicon wafer is overlapped so that the columnar patterns described above contact the isoprene rubber sheet having a surface on which the liquid silicone rubber is formed. Pressure is reduced to remove air bubbles. Thereafter, the wafer and the sheet are left at room temperature while pressing the silicon wafer. The silicone rubber is thus hardened. In this manner, the columnar patterns are embedded in the hardened liquid silicone rubber. Thereafter, the silicon wafer is peeled off from the hardened liquid silicone rubber. The columnar patterns together with the hardened silicone rubber are transferred thereby to styrene-isoprene copolymer. At this time, the columnar patterns are embedded in the silicone rubber and the styrene-isoprene copolymer while only circular portions made of Ni at bottoms are exposed.

Thereafter, stress to the isoprene rubber sheet is released to bring the isoprene rubber sheet into a force free state. The pitch of the columnar patterns in the hardened liquid silicone rubber is thereby reduced to 200 nm from 300 nm. Next, only nickel is etched by 30 wt % sulfuric acid at 70° C. In this manner, pores each having a diameter of 50 nm are formed at the pitch of 200 nm in the hardened liquid silicone rubber formed on the surface of isoprene rubber. A platinum layer is formed on the bottom portion of each pore. Dipping in an electroless nickel plating solution causes electroless nickel plating to separate out of platinum in the bottom portions of the pores and to fill the pores. Thereafter, electroless nickel plating is carried out, and plated material is peeled off. Thus obtained is a nanoimprint mold on which columns each having a diameter of 80 nm are arrayed at the pitch of 200 nm.

Example 15

The example 15 of the present invention will be described with reference to an exemplar configuration in which a pattern is reduced in scale by use of a transfer pattern manufactured by plating using as a mold anodically oxidized alumina nanoholes arrayed regularly. FIGS. 16A to 16G depict an exemplar configuration according to this example.

Figure 16A:
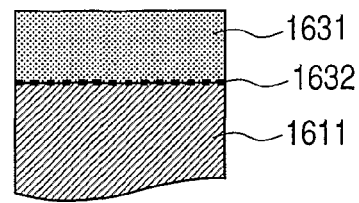
FIGS. 16A, 16B, 16C, 16D, 16E, 16F, and 16G depict an exemplar configuration according to the example 15 of the present invention, in which a pattern is reduced in scale by use of a transfer pattern manufactured by plating with anodically oxidized (or anodized) alumina nanoholes used as a mold, the nanoholes arrayed regularly.
Figure 16B:
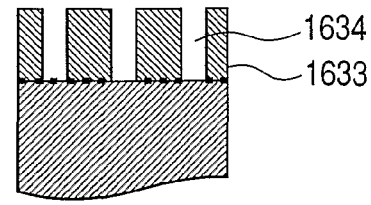

A film of Ti as a conductive layer 1632 having a thickness of 10 nm and a film of Al as 1631 having a thickness of 200 nm are formed on a silicon wafer 1611 (FIG. 16A). A resist layer is formed on the Al film by spin coating. Next, using an Si mold on which protrusions are formed at triangular lattice positions at a pitch of 160 nm, depression structures having a pitch of 160 nm are formed in the resist layer by a thermal nanoimprint method. Next, dry etching is carried out to form depression structures in the surface of Al at positions corresponding to the depression structures in the resist. Thereafter, anodic oxidation is carried out at 64 V using oxalic acid. Aluminum is thereby oxidized to form alumina 1633, and nanoholes 1634 are formed in a perpendicular direction to the substrate at triangular lattice positions at the pitch of 160 nm (FIG. 16B).

Figure 16C:
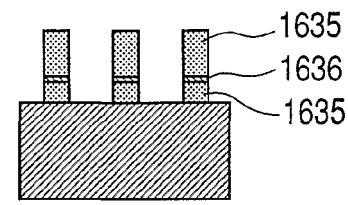

The diameter of each nanoholes is enlarged by dipping in a phosphoric acid solution. Thereafter, Ni plating 1635 is performed to a thickness of 50 nm near bottom portions of pores. Thereafter, baking is carried out at 60° C. for an hour, to form an oxide film 1636 on the surface of Ni obtained by plating. Further, Ni plating 1635 is provided (FIG. 16C). The second Ni plating is continued until Ni forms a continuous film outside the nanoholes after the nanoholes are filled with Ni. Ni outside the nanoholes is removed by polishing. Thereafter, alumina is removed by dipping in a sodium hydroxide solution. In this manner, columnar Ni patterns each having a diameter of 80 nm and height of 200 nm are formed on the Si wafer.

Figure 16D:
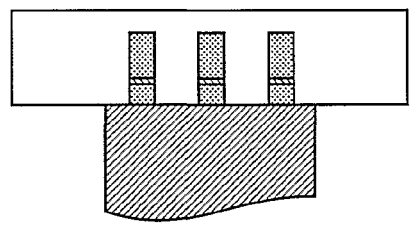
Figure 16E:
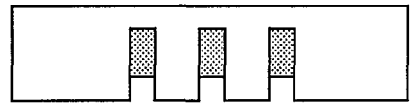
Figure 16F:
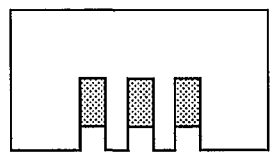
Figure 16G:
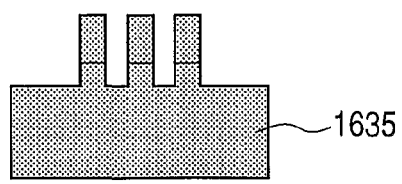

Next, the columnar Ni patterns are pressed to a process target. Tuftec manufactured by ASAHI KASEI CHEMICALS CORPORATION which is styrene-butadiene copolymer is used as the process target. After the styrene-butadiene copolymer is extended to a deformation rate of 200%, the Si wafer having a surface on which the columnar patterns are formed is hot-pressed. At this time, the columnar patterns are made contact the styrene-butadiene copolymer (FIG. 16D). When the Si wafer is peeled from the styrene-butadiene copolymer after cooling to room temperature, the columnar patterns are separated by the Ni oxide layer, and the top end portions of the columnar patterns are transferred to styrene-isoprene copolymer. Thereafter, load to the styrene-butadiene copolymer is released to attain a force free state. The pitch of the columnar Ni patterns on the styrene-butadiene copolymer is thereby reduced to 50%. Thereafter, sputtering is performed on the surface of the styrene-butadiene copolymer from which the columnar Ni patterns are partially exposed. Thereafter, Ni plating is performed, and dissolution is carried out with styrene-butadiene copolymer toluene. Thus, an Ni mold having a pitch of 80 nm which can be used for thermal nanoimprinting is formed.

Example 16

The example 16 of the present invention will now be described with reference to an exemplar configuration in which a process substrate made of an elastically deformable material is repeatedly extended and shrunk and a pattern is formed on the surface of the process substrate every time when extension or shrinkage is carried out, thereby to form a structure having a micropattern. See FIGS. 17A to 17I.

As a process substrate 1701, Sylgard 184 Silicone Elastomer manufactured by DOW CORNING TORAY CO. LTD. which is silicone rubber is used preprocessed into a shape like a thin film. The process substrate 1701 is extended in longitudinal directions so that a deformation rate reaches 150%. The process substrate is maintained intact (FIG. 17B). 1704 denotes the substrate after deformation.

Next, a film of aluminum is formed by sputtering on a process surface 1702. Thereafter, resist is coated on the surface of aluminum. Exposure, development, etching, and forming of a thin film of resist are carried out to form line patterns 1707 at a pitch of 1500 nm and a depression structure 1708 in the surface of the process substrate, the line patterns each having a width of 600 nm (FIG. 17C). Next, the extension force is removed to recover a shape before extension (FIG. 17D). At this time, those portions of the process substrate that contact aluminum are reduced in scale by a smaller amount because aluminum has lower elastic modulus than the process substrate. Therefore, each of patterns like lines formed on the process substrate surface by etching has an inverted tapered shape.

Figure 17H:
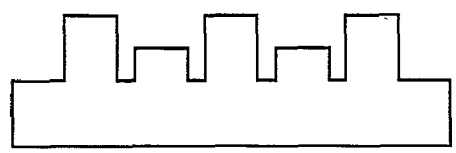
Figure 17I:
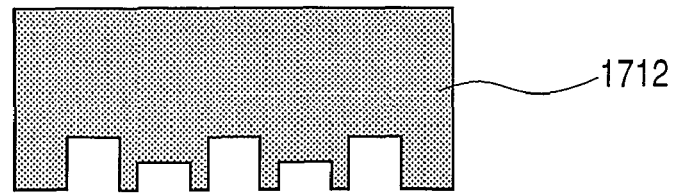

Next, sputtering of aluminum is carried out again on the process substrate, to form an aluminum layer 1710 above projecting structures each having the inverted tapered shape and on areas between the projecting structures (FIG. 17E). Thereafter, extension is performed so that the deformation rate in the longitudinal direction reaches 150% (FIG. 17E). After extension, the surface of silicone rubber is processed by etching again, to form a depression structure 1711 (FIG. 17G). Thereafter, the process substrate is dipped in 50 wt % phosphoric acid to remove the aluminum layer from the surface. Extension of the silicone rubber is released. In this manner, line patterns each having a width of 400 nm are formed at a pitch of 500 nm on the surface (FIG. 17H). Pt is sputtered on the surface of silicone rubber where the patterns are formed. Thereafter, Ni plating is carried out, and plated material is peeled off from the silicon rubber. A structure 1712 to which depression and projecting structures formed on the process surface have been transferred is thereby obtained (FIG. 17I). The transfer structure 1712 has a surface in which line patterns each having the width of 400 nm are formed at the pitch of 500 nm. This structure 1712 can be used as a mold for nanoimprinting.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

This application claims priorities from Japanese Patent Application Nos. 2005-257408 filed Sep. 6, 2005, 2006-070832 filed Mar. 15, 2006 and 2006-230610 filed Aug. 28, 2006, which are hereby incorporated by reference herein.

The invention claimed is:

1. A method for manufacturing a structure having a pattern, comprising the steps of:
    elastically deforming a target in an in-plane direction from a first state to a second state, the target having a surface extending in the in-plane direction;
    forming a first pattern on the surface of the target as deformed by embedding a projection formed on a substrate in the surface, the projection having a higher elastic modulus than the target;
    removing the substrate to transfer the projection as embedded in the target;
    bringing the target back to a state close to the first state from the second state; and
    removing the projection from the target, thereby to form a second pattern having a size and a shape at least one of which differs from those of the first pattern.

2. The method according to claim 1, wherein deformation of the process target in an in-plane direction in process of the forming of the pattern comprises extension in at least one of the in-plane directions, and reduction in scale in at least one different direction.

3. The method according to claim 1, wherein the process surface is a curved surface.

4. The method according to claim 1, wherein the deformation rate of the process target in an in-plane direction between before and after the forming of the first pattern is not higher than 90% or not lower than 110% within a deformable range of the process target.

5. The method according to claim 1, wherein the elastically deformable material is a material having elastic modulus ranging from 1 MPa to 20 MPa.

6. A method for manufacturing a structure having a pattern, comprising the steps of:
    elastically deforming a target in an in-plane direction from a first state to a second state;
    forming a pattern member on a surface of the target as deformed, the pattern member being constituted by including a material different from that of the target; and
    bringing the target back to a state close to the first state without changing a contact area between the pattern member and the target.

7. A method for manufacturing a mold, comprising:
    elastically deforming a target in an in-plane direction from a first state to a second state, the target having a surface extending in the in-plane direction;
    forming a first pattern on the surface of the target as deformed by embedding a projection formed on a substrate in the surface, the projection having a higher elastic modulus than the target;
    removing the substrate to transfer the projection as embedded in the target;
    bringing the target back to a state close to the first state from the second State;
    removing the projection from the target, thereby to form a second pattern having a size and a shape at least one of which differs from those of the first pattern; and
    filling a material in the second pattern.

* * * * *